(12) United States Patent
Tsukamoto

(10) Patent No.: US 7,898,450 B2
(45) Date of Patent: Mar. 1, 2011

(54) ANALOG SIGNAL PROCESSING DEVICE

(75) Inventor: Sanroku Tsukamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 2 days.

(21) Appl. No.: 12/544,948

(22) Filed: Aug. 20, 2009

(65) Prior Publication Data

US 2009/0309777 A1 Dec. 17, 2009

Related U.S. Application Data

(63) Continuation of application No. PCT/JP2007/053325, filed on Feb. 22, 2007.

(51) Int. Cl.
*H03M 1/36* (2006.01)
(52) U.S. Cl. .................. 341/159; 382/278; 348/308; 330/255; 327/73
(58) Field of Classification Search ......... 341/155–170; 348/301–323; 330/255, 253; 382/278; 327/73, 327/18, 205, 355
See application file for complete search history.

(56) References Cited

U.S. PATENT DOCUMENTS

| 6,218,975 | B1 | 4/2001 | Tsukamoto et al. |
| 6,410,903 | B1* | 6/2002 | Miyazaki ............. 250/214 SW |
| 6,420,983 | B1 | 7/2002 | Feygin et al. |
| 6,546,150 | B2* | 4/2003 | Inui ........................... 382/278 |
| 6,727,486 | B2 | 4/2004 | Choi |
| 6,778,124 | B2 | 8/2004 | Hashimoto et al. |
| 6,836,237 | B2 | 12/2004 | Sakamoto |
| 7,746,252 | B2* | 6/2010 | Mizuta ....................... 341/118 |
| 7,755,522 | B1* | 7/2010 | Song et al. ................ 341/120 |
| 7,808,413 | B2* | 10/2010 | Griffith et al. .............. 341/141 |

2003/0179120 A1 9/2003 Hashimoto et al.

(Continued)

FOREIGN PATENT DOCUMENTS

| JP | 11-145832 A | 5/1999 |
| JP | 2002-033663 A | 1/2002 |
| JP | 2003-218698 A | 7/2003 |

(Continued)

OTHER PUBLICATIONS

Yuko Tamba et al.; "A CMOS 6b 500MSample/s ADC for a hard disk drive read channel", IEEE International Solid-State Circuits Conference; vol. XLII; pp. 324-325; Feb. 1999.

(Continued)

*Primary Examiner*—Lam T Mai
(74) *Attorney, Agent, or Firm*—Arent Fox LLP

(57) ABSTRACT

An analog signal processing device including a voltage selector selecting a given comparison reference voltage from plural comparison reference voltages, an arithmetic unit arithmetically processing the given comparison reference voltage and an analog input signal, a comparator which has at least one or more judgment points for the plural comparison reference voltages and to which an output of the arithmetic unit is inputted, and a coupling controller controlling connections between the arithmetic unit and the comparator, wherein the arithmetic unit comprises correctable first signal processors, and the number of the first signal processors is more than is necessary for the plural comparison reference voltages by M or larger, and when a set of N of first signal processors are in a correction operation, the coupling controller connects first signal processors which are not in the correction operation in the arithmetic unit to the comparator.

11 Claims, 11 Drawing Sheets

FOREIGN PATENT DOCUMENTS

JP      2003-283335 A      10/2003

OTHER PUBLICATIONS

Joe Spalding et al.; A 200Msample/s, 6b flash ADC in 0.6μm CMOS; IEEE International Solid-State Circuits Conference; vol. XXXIX; pp. 320-321; Feb. 1996.

Iuri Mehr et al.; "A 500-Msample/s 6-bit Nyquist-rate ADC for disk drive read-channel applications", IEEE Journal of Solid-State Circuits; vol. 34; pp. 912-920; Jul. 1999.

Sanroku Tsukamoto et al.; "A CMOS 6-b, 200 Msample/s, 3 V-supply A/D converter for a PRML read channel LSI" IEEE Journal of Solid-State Circuits; vol. 31, pp. 1831-1836; Nov. 1996.

M. Steyaert ey al.; "A 100 MHz 8 bit CMOS interpolating A/D converter", 1993 IEEE Custom Integrated Circuits Conference; May 1993.

Hiroshi Kimura et al.; "A 10-b 300 MHz interpolated-parallel A/D converter"; IEEE Journal of Solid-State Circuits; vol. 28; pp. 438-446; Apr. 1993.

S. Tsukamoto et al.; "A CMOS 6-b, 200 MSample/s, 3 V-supply A/D converter for a PRML read channel LSI" ; IEEE Journal of Solid-State Circuits; vol. 31; No. 11; Nov. 1996; pp. 1831-1836.

* cited by examiner

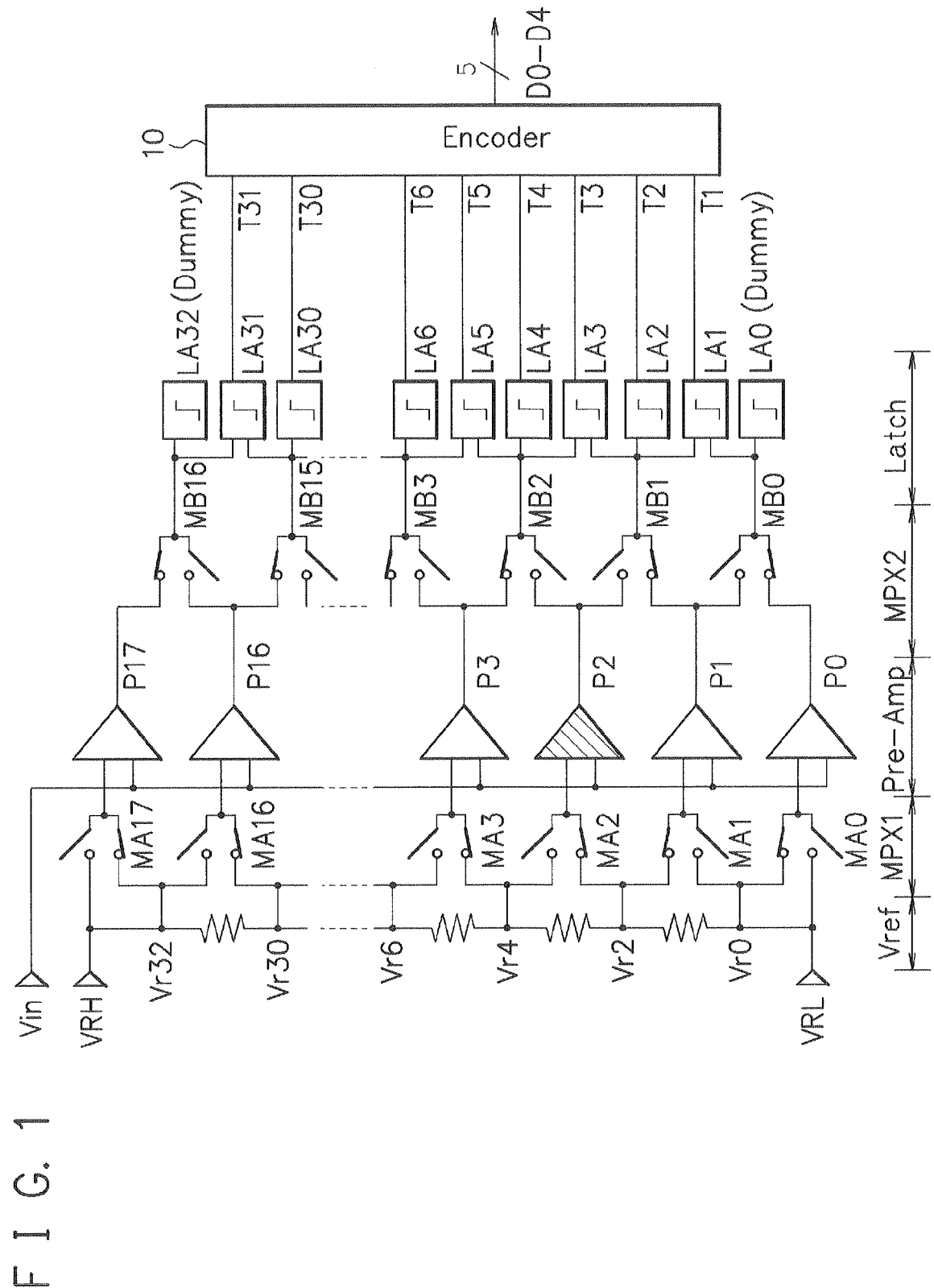
F I G. 1

F I G. 5
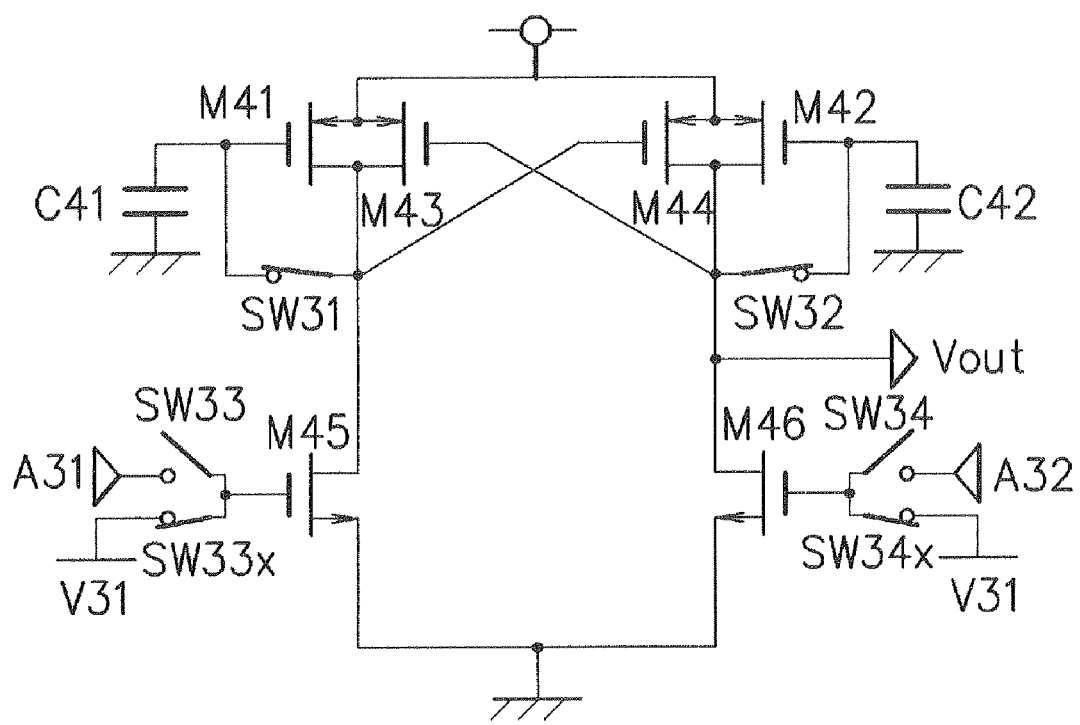

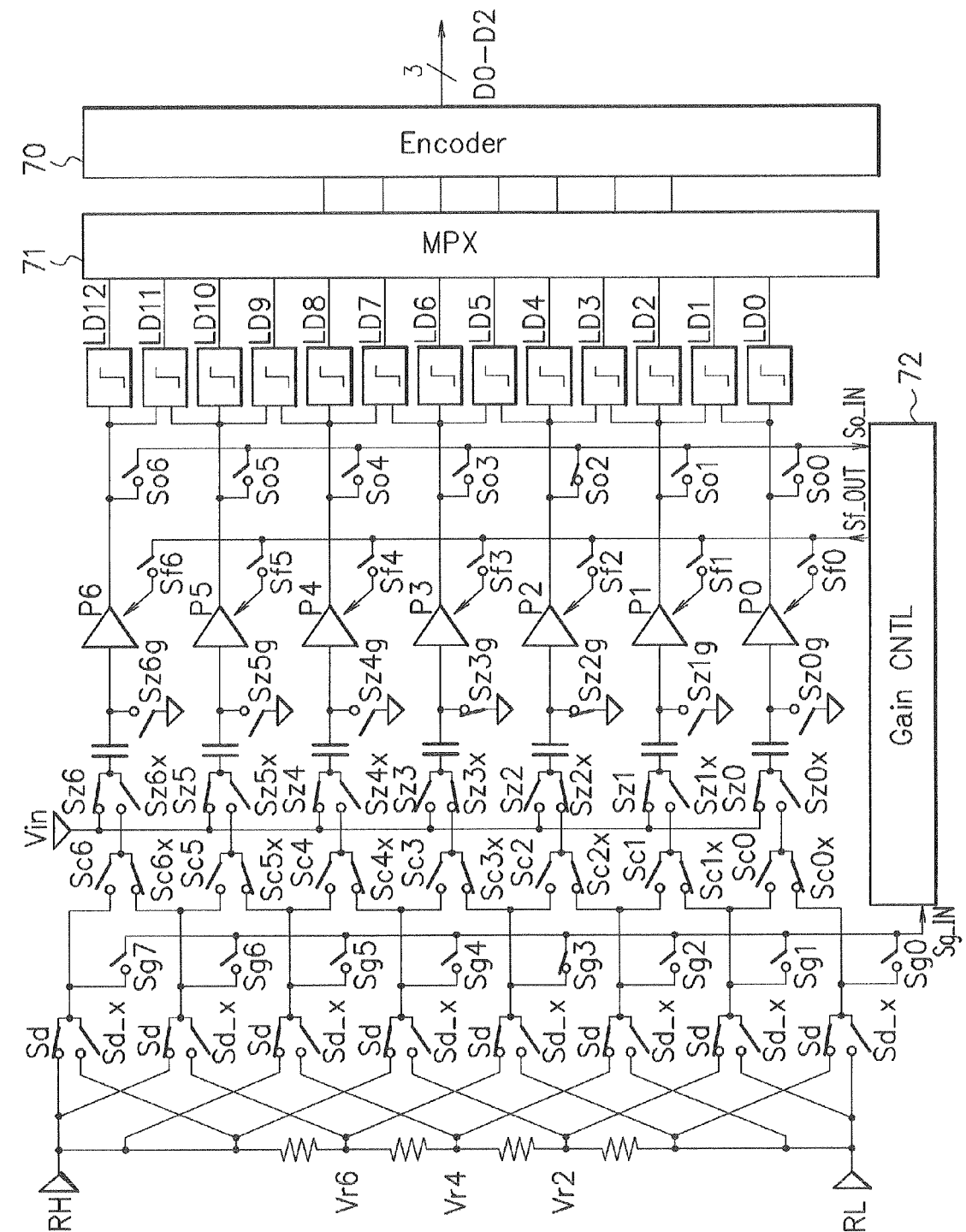
F I G. 7

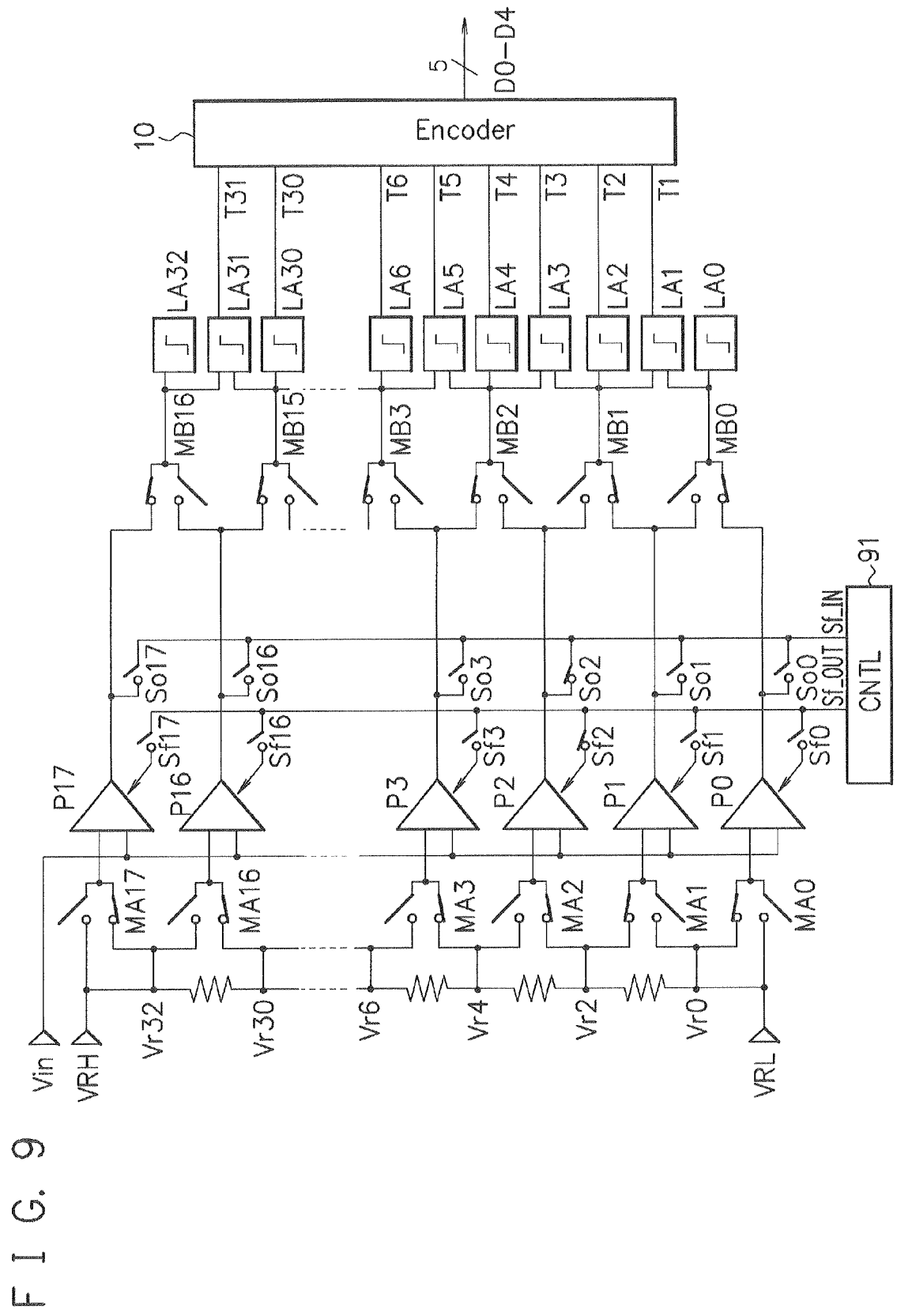
F I G. 9

F I G. 12
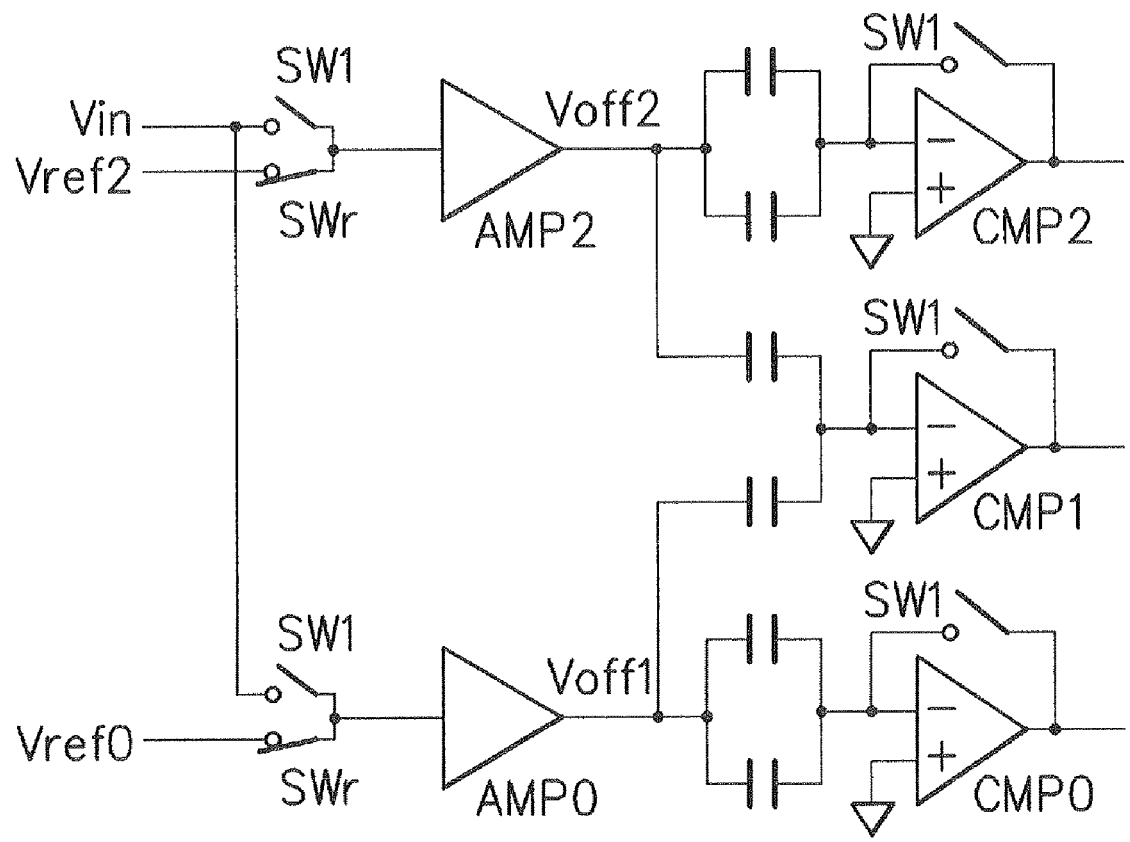

ANALOG SIGNAL PROCESSING DEVICE

CROSS-REFERENCE TO RELATED APPLICATIONS

This is a continuation of International Application No. PCT/JP2007/053325, filed on Feb. 22, 2007, the entire contents of which are hereby incorporated by reference.

FIELD

The present embodiment relates to an analog signal processing device, and a correction technique in an analog signal processing device having a plurality of signal processing units.

BACKGROUND

For high-speed analog/digital conversion, generally a parallel-type A/D converter (hereinafter also referred to as "ADC") is often used. In the case of an n-bit parallel-type ADC, ($2^n$-1) number of voltage comparators are disposed in parallel, and a comparison reference voltage is given to each voltage comparator. Each voltage comparator compares the given comparison reference voltage with an analog input signal, and transmits the comparison result to an encoder, and the encoder finally converts it into a digital value.

The voltage comparator is generally divided into a preamplifier unit amplifying an input and a latch unit judging a value of '1' or '0' at last. The comparison reference voltage and the analog input signal are amplified by the preamplifier unit to a level that can be judged by the latch unit in a latter stage, so as to achieve precision.

However, in the parallel-type ADC, the number of voltage comparators increases exponentially when it is tried to raise the resolution, which presents a problem that enlargement of circuit scale, increase in power consumption, and increase in input capacity of an analog signal input terminal become obvious.

Further, on the other hand, to realize an analog circuit, countermeasures for manufacturing dispersion of elements in manufacturing processes of semiconductors and for fluctuation of characteristics of elements depending on an ambient temperature when operating are significant problems.

Particularly, the evolution (miniaturization) of CMOS processes has brought about increase in integration and speed due to miniaturization, and reduction of power consumption by lowering power supply voltage, which are generally called "scaling effects" in digital circuits. On the other hand, in analog circuits, problems have become obvious such as reduction in analog signal dynamic range accompanying lowering of power supply voltage, increase in element characteristic dispersion accompanying miniaturization, temperature variation due to mixing with large-scale digital circuits, and the like.

The reduction in analog signal dynamic range has direct influence on signal accuracy, which has lead to increase in element size for realizing high accuracy of internal elements. Furthermore, this causes increase in parasitic capacitance and consequently hinders realization of high speed.

Furthermore, even when the dynamic range is reduced, the noise level generated by heat, which is called kT/C noise, does not change. For reducing its influence, it may be necessary to increase C (capacitance value). However, this causes increase in load, which is a factor of hindering realization of high speed.

Conventionally, a high-voltage element may be used for avoiding the reduction in dynamic range, but it is disadvantageous in terms of performance and cost because the "scaling effects" cannot be utilized. Further, using relatively larger elements (for example, increasing a channel length for a transistor) for the purpose of improving characteristic dispersion of elements is a general method, but it units the similar as the increase in element size for realizing high accuracy of internal elements and is disadvantageous for realizing high speed.

As one of methods for controlling characteristic dispersion of elements, there is calibration. By setting a calibration period, many of conventional techniques perform the calibration while halting a normal operation for a given period (see Non-Patent Documents 1 to 3).

However, application of this method is limited since the normal operation is halted during the calibration period. On the other hand, there is reported a method of performing the calibration in the background (see Non-Patent Document 4).

According to this method, it is not required to set a special calibration period, so its application is not limited. However, it has a problem of increasing the number of elements because it involves a full parallel structure. Particularly, an input unit is connected in parallel when seen from a signal input terminal, which increases the load and is disadvantageous for achieving high speed.

Further, a units for interpolating an analog signal is effective for solving problems as described above, and many such units are reported (see Non-Patent Documents 5, 6). Further, a technique combining interpolation of an analog signal and the calibration in the background is also suggested (see Patent Document 1).

However, in the conventional calibration, there are two technical problems as follows. It may be necessary to correct an offset, common mode, and gain for performing interpolation accurately, but correction of only the offset is possible and the gain cannot be corrected. Moreover, a comparator with redundancy, such that a comparator of the main series performs a conversion operation as a substitute during calibration, is at a separated position from the comparator of the main series. Thus, it is not possible to retain continuity of power supply conditions, analog signal wirings, clock signal wirings, and so on. This becomes a problem in a high speed operation. A precise operation cannot be performed due to inversion of continuous relationship or sequence of signals and power supply.

As described above, in the conventional interpolation method and calibration method, precise correction of interpolation points is not possible. Therefore, for obtaining given accuracy, one is compelled to obey a conventional design method for suppressing errors of interpolation points, that is, setting to an element size by which relative accuracy can be secured. This conventional design method cannot benefit from the "scaling effects" and has been a constraint in the aspect of performance. Further, the method described in Patent Document 1 causes inversion of the order of arrangement, and thus has a problem of dynamic characteristics.

Patent Document 1: Japanese Laid-open Patent Publication No. 2002-33663

Patent Document 2: Japanese Laid-open Patent Publication No. 2003-218698

Patent Document 3: Japanese Laid-open Patent Publication No. 2003-283335

Non-Patent Document 1: Yuko Tamba, Kazuo Yamakido; A CMOS 6b 500 MSample/s ADC for a hard disk drive read channel, IEEE International Solid-State Circuits Conference, vol. XLII, pp. 324-325, February 1999

Non-Patent Document 2: Joe Spalding, Declan Dalton; A 200Msample/s 6b flash ADC in 0.6 μm CMOS, IEEE International Solid-State Circuits Conference, vol. XXXIX, pp. 320-321, February 1996.

Non-Patent Document 3: Iuri Mehr, Declan Dalton; A 500-Msample/s, 6-bit Nyquist-rate ADC for disk-drive read-channel applications, IEEE Journal of Solid-State Circuits, vol. 34, pp. 912-920, July 1999.

Non-Patent Document 4: Sanroku Tsukamoto, Ian Dedic, Toshiaki Endo, Kazu-yoshi Kikuta, Kunihiko Goto, Osamu Kobayashi; A CMOS 6-b, 200 Msample/s, 3 V-supply A/D converter for a PRML read channel LSI, IEEE Journal of Solid-State Circuits, vol. 31, pp. 1831-1836, November 1996.

Non-Patent Document 5: M. Steyaert, R. Roovers, J. Craninckx; A 100 MHz 8 bit CMOS interpolating A/D converter, 1993 IEEE Custom Integrated Circuits Conference, May 1993.

Non-Patent Document 6: Hiroshi Kimura, Akira Matsuzawa, Takashi Nakamura, Shigeki Sawada; A 10-b 300-MHz interpolated-parallel A/D converter, IEEE Journal of Solid-State Circuits, vol. 28, pp. 438-446, April 1993.

SUMMARY

According to an aspect of the embodiment, an analog signal processing device includes a voltage selector selecting a given comparison reference voltage from plural comparison reference voltages, an arithmetic unit arithmetically processing the given comparison reference voltage and an analog input signal, a comparator which has at least one or more judgment points for the plural comparison reference voltages and to which an output of the arithmetic unit is inputted, and a coupling controller controlling connections between the arithmetic unit and the comparator, wherein the arithmetic unit comprises correctable first signal processors, and the number of the first signal processors is more than may be necessary for the plural comparison reference voltages by M or larger (where M is a natural number), and when a set of N (where N is a natural number and N≦M) of first signal processors are in a correction operation, the coupling controller connects first signal processors which are not in the correction operation in the arithmetic unit to the comparator.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 1 is a diagram depicting a structural example of a parallel-type ADC according to a first embodiment;

FIG. 5 is a diagram depicting a structural example of a latch having a latch unit;

FIG. 7 is a diagram depicting a structural example of a parallel-type ADC according to a fourth embodiment;

FIG. 9 is a diagram depicting another structural example of a parallel-type ADC according to the fourth embodiment;

FIG. 12 is a diagram for explaining a structure and correction of an interpolation latch in this embodiment.

DESCRIPTION OF THE EMBODIMENTS

Figure 2:
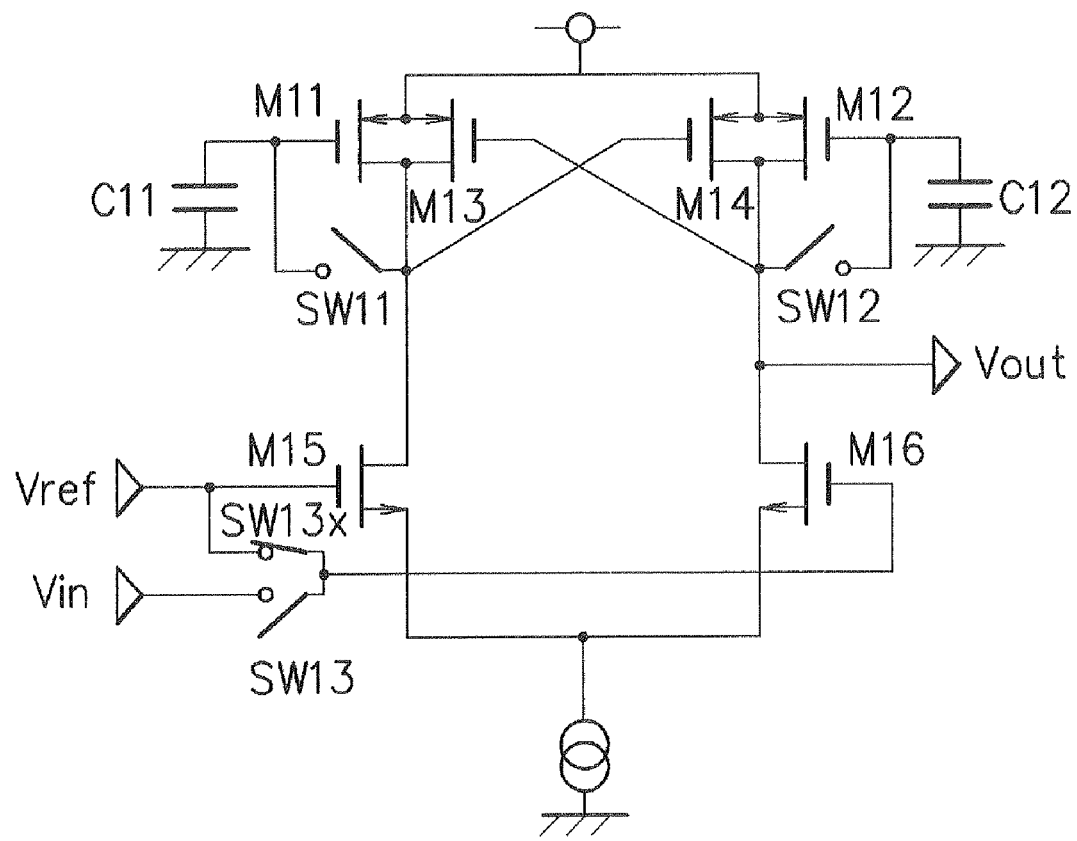
FIG. 2 is a diagram depicting a structural example of a preamplifier having a preamplifier unit.

Hereinafter, embodiments will be explained based on the drawings.

First Embodiment

FIG. 1 is a diagram depicting a structural example of a parallel-type A/D converter (parallel-type ADC) to which an analog signal processing device according to a first embodiment is applied. The parallel-type ADC according to the first embodiment converts an inputted analog input signal Vin into a 5-bit digital signal D0-D4.

In FIG. 1, Vref denotes a reference voltage generating unit generating plural comparison reference voltages based on a reference voltage. The reference voltage generating unit Vref divides the voltage between a voltage VRH and a voltage VRL (by resistors in this embodiment) to generate comparison reference voltages Vr0, Vr2, . . . , Vr32.

MPX1 denotes a voltage selecting unit selecting a comparison reference voltage to be outputted from the plural comparison reference voltages Vr0, Vr2, . . . , Vr32 generated by the reference voltage generating unit Vref. In this embodiment, the voltage selecting unit MPX1 is formed by a multiplexer having plural switches MA0, MA1, . . . , MA17.

Pre-Amp denotes a preamplifier unit to which a comparison reference voltage selected by the voltage selecting unit MPX1 and the analog input signal Vin are inputted. The preamplifier unit Pre-Amp is formed by plural preamplifiers P0, P1, . . . , P17 which arithmetically process an inputted comparison reference voltage and the analog input signal Vin. To each of the preamplifiers P0, P1, . . . , P17, the selected comparison reference voltage and the analog input signal Vin are inputted and arithmetically processed therein, and an obtained differential voltage between the comparison reference voltage and the analog input signal Vin is amplified and outputted.

MPX2 denotes a connecting unit controlling connections between the preamplifiers P0, P1, . . . , P17 forming the preamplifier unit Pre-Amp and latches LA0, LA1, . . . , LA32 forming a latch unit Latch. The connecting unit MPX2 is formed by a multiplexer having plural switches MB0, MB1, . . . , MB17.

The latch unit Latch is for judging a value of '1' or '0' at last. The latch unit Latch is formed by the plural latches LA0, LA1, . . . , LA32, and each of the latches LA0, LA1, . . . , LA32 has at least one or more judgment points for the comparison reference voltages and outputs a judgment result. In addition, the latches LA0 and LA32 are provided for reducing occurrence of a difference between loads.

Numeral 10 denotes an encoder. The encoder 10 encodes outputs T1, T2, . . . , T31 from the latch unit Latch and outputs a digital signal D0-D4.

The parallel-type ADC in the first embodiment performs calibration in the background in the preamplifier unit Pre-Amp so as to compensate characteristic dispersion which the preamplifiers P0 to P17 have, so as to have improved accuracy. The number of preamplifiers forming the preamplifier unit Pre-Amp is not necessarily 18 as long as they are of 5-bit, but in this embodiment, more preamplifiers than is necessary are provided as depicted in FIG. 1. When one preamplifier is performing a correction operation, an adjacent preamplifier performs a normal operation.

FIG. 1 depicts the case of performing calibration in the preamplifier P2 in the preamplifier unit Pre-Amp.

When performing calibration in the preamplifier P2, a comparison reference voltage Vr2 is inputted to the preamplifier P2 via the switch MA2, and the calibration is performed based on this voltage. At this time, the comparison reference voltage Vr2 is inputted to the adjacent preamplifier P1 via the switch MA1, and similarly a comparison reference voltage Vr4 is inputted to the adjacent preamplifier P3 via the switch MA3. The preamplifiers P1, P3 respectively amplify differential voltages with respect to the analog input signal Vin.

In the connecting unit MPX2 in a stage after the preamplifier unit Pre-Amp, the switches MB0 to MB16 are controlled appropriately, and outputs of the preamplifiers P0 to P17 are transmitted to the latches LA0 to LA32 having an interpolation function excluding an output of the preamplifier P2 in which the calibration is performed.

Among the latches LA0 to LA32, a latch connected directly to a preamplifier (for example, LA2, LA4, or the like) makes a judgment on a magnitude relation between the comparison reference voltage and the analog input signal Vin based on an output of the connected preamplifier. Further, an interpolation latch (for example, LA1, LA3, or the like) connected to outputs of two preamplifiers makes a judgment based on the average of respective outputs of the preamplifiers, and hence makes a judgment on magnitude with respect to the analog signal Vin, with a middle point of the comparison reference voltages of the connected preamplifiers being a virtual judgment point. Finally, outputs of these latches LA0 to LA32 are sent to the encoder 10, where they are encoded and converted into digital values.

One structural example of the preamplifier P0 to P17 having the preamplifier unit Pre-Amp is depicted in FIG. 2. While calibration of a preamplifier is performed, there is created a state that switches SW11, SW12, SW13$x$ are closed and a switch SW13 is opened. Thus, amplification is performed in a state that a comparison reference voltage Vref is received by gates of both MOS transistors M15, M16 in a differential stage, and simultaneously the amplified voltages are recorded in capacitors C11, C12.

Next, there is created a state that switches SW11, SW12, SW13$x$ are opened and the switch SW13 is closed, and thus voltages thereof are retained in the capacitors C11, C12. Consequently, a current value at the time of inputting the comparison reference voltage Vref is retained in MOS transistors M11, M12. The difference between the signal level of the analog input signal Vin and the comparison reference voltage Vref is amplified by the MOS transistors M13, M14 and is outputted as an output Vout.

Figure 3:
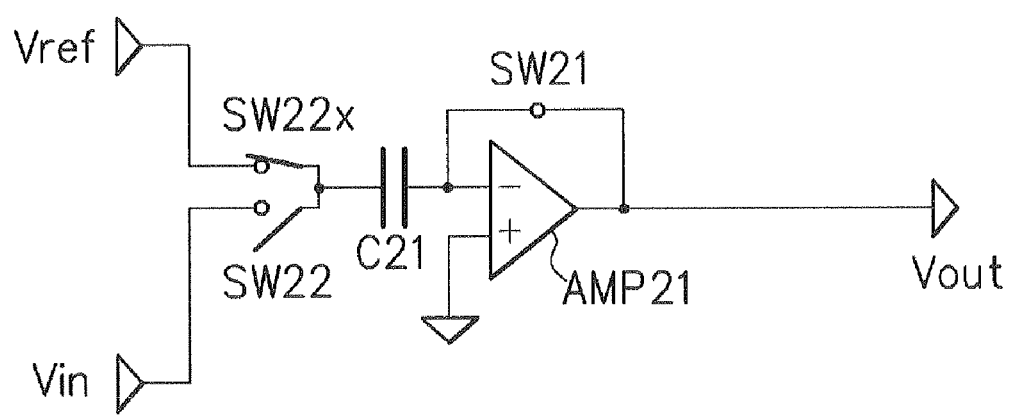
FIG. 3 is a diagram depicting another structural example of the preamplifier having the preamplifier unit.

Another structural example of the preamplifier P0 to P17 having the preamplifier unit Pre-Amp is depicted in FIG. 3. In the preamplifier depicted in FIG. 3, a storage unit for storing the comparison reference voltage Vref is provided, and the comparison reference voltage Vref is stored directly and individually.

An amplifier AMP21 is virtually grounded to the potential to which a non-inverted terminal is connected, by short-circuiting an inverted input terminal and an output by a switch SW21. At this time, simultaneously, there is created a state that a switch SW22$x$ is closed and the switch SW22 is opened, and thereby the comparison reference voltage Vref is supplied to a capacitor C21. Accordingly, a charge $C \times (Vref - GND)$ is stored in the capacitor C21, where C is capacitance value of the capacitor C21.

Next, the switch SW21 which short circuits the input and output of the amplifier AMP21 is opened, and thereafter, the switch SW22$x$ is opened and then the switch SW22 is closed, thereby causing a differential voltage (Vref−Vin) between the comparison reference voltage Vref and the analog input signal Vin to be applied to the capacitor C21. At this time, the node point between the capacitor 21 and the amplifier AMP21 has no path where a charge escapes, and according to the law of conservation of charge, the differential voltage (Vref−Vin) appears at the node between the capacitor C21 and the amplifier AMP21. Thus, the differential voltage (Vref−Vin) is amplified by the amplifier AMP21 and is transmitted to the latch as the output Vout.

Table 1 depicts actual calibration setting in the preamplifier unit Pre-Amp in the parallel-type ADC depicted in FIG. 1. In Table 1, the comparison reference voltages to be inputted to the preamplifiers P0 to P17 and states of the preamplifiers P0 to P17 are shown. Italic letters indicate that calibration is performed, and normal letters indicate that a normal operation is performed.

TABLE 1

| Pre-Amp | State | | | | | | | | | | |
|---|---|---|---|---|---|---|---|---|---|---|---|
| | init. | S0 | S1 | S2 | S3 | S4 | S5 | ... | S15 | S16 | S17 |
| P17 | *Vr32* | Vr32 | Vr32 | Vr32 | Vr32 | Vr32 | Vr32 | | Vr32 | Vr32 | *Vr32* |
| P16 | *Vr30* | Vr30 | Vr30 | Vr30 | Vr30 | Vr30 | Vr30 | | Vr30 | *Vr32* | Vr32 |
| P15 | *Vr28* | Vr28 | Vr28 | Vr28 | Vr28 | Vr28 | Vr28 | | *Vr30* | Vr30 | Vr30 |
| P5 | *Vr8* | Vr8 | Vr8 | Vr8 | Vr8 | Vr8 | *Vr10* | | Vr10 | Vr10 | Vr10 |
| P4 | *Vr6* | Vr6 | Vr6 | Vr6 | Vr6 | *Vr8* | Vr8 | | Vr8 | Vr8 | Vr8 |
| P3 | *Vr4* | Vr4 | Vr4 | Vr4 | *Vr6* | Vr6 | Vr6 | | Vr6 | Vr6 | Vr6 |
| P2 | *Vr2* | Vr2 | Vr2 | *Vr4* | Vr4 | Vr4 | Vr4 | | Vr4 | Vr4 | Vr4 |
| P1 | *Vr0* | Vr0 | *Vr2* | Vr2 | Vr2 | Vr2 | Vr2 | | Vr2 | Vr2 | Vr2 |
| P0 | *Vr0* | *Vr0* | Vr0 | Vr0 | Vr0 | Vr0 | Vr0 | | Vr0 | Vr0 | Vr0 |

TABLE 1-continued

| | State | | | | | | | | | | |
|---|---|---|---|---|---|---|---|---|---|---|---|
| Pre-Amp | S18 | S19 | ... | S29 | S30 | S31 | S32 | S33 | S0 | S1 | S2 |
| P17 | Vr32 | Vr32 | | Vr32 | Vr32 | Vr32 | Vr32 | Vr32 | Vr32 | Vr32 | Vr32 |
| P16 | *Vr30* | Vr30 | | Vr30 | Vr30 | Vr30 | Vr30 | Vr30 | Vr30 | Vr30 | Vr30 |
| P15 | Vr30 | *Vr28* | | Vr28 | Vr28 | Vr28 | Vr28 | Vr28 | Vr28 | Vr28 | Vr28 |
| P5 | Vr10 | Vr10 | | *Vr8* | Vr8 | Vr8 | Vr8 | Vr8 | Vr8 | Vr8 | Vr8 |
| P4 | Vr8 | Vr8 | | Vr8 | *Vr6* | Vr6 | Vr6 | Vr6 | Vr6 | Vr6 | Vr6 |
| P3 | Vr6 | Vr6 | | Vr6 | Vr6 | *Vr4* | Vr4 | Vr4 | Vr4 | Vr4 | Vr4 |
| P2 | Vr4 | Vr4 | | Vr4 | Vr4 | Vr4 | *Vr2* | Vr2 | Vr2 | Vr2 | *Vr4* |
| P1 | Vr2 | Vr2 | | Vr2 | Vr2 | Vr2 | Vr2 | *Vr0* | Vr0 | *Vr2* | Vr2 |
| P0 | Vr0 | Vr0 | | Vr0 | Vr0 | Vr0 | Vr0 | Vr0 | *Vr0* | Vr0 | Vr0 |

By disposing one more preamplifier than is necessary in the preamplifier unit Pre-Amp and performing calibration sequentially, it is possible to perform the calibration in the background while performing a normal operation. As depicted in Table 1, the calibration of each preamplifier Pi is performed in a state Si (i=0 to 17), and the calibration of each preamplifier P (34−i) is performed in a state Si (i=18 to 33).

The state depicted in FIG. 1 corresponds to the state S32 in Table 1. When interpolation is performed in this manner, conventionally there has been a problem that the latch unit Latch located in a latter stage cannot perform a normal operation. However, in this embodiment, this problem is solved by providing the connecting unit MPX2 between the preamplifier unit Pre-Amp and the latch unit Latch.

Second Embodiment

Next, a second embodiment will be explained.

Figure 4:
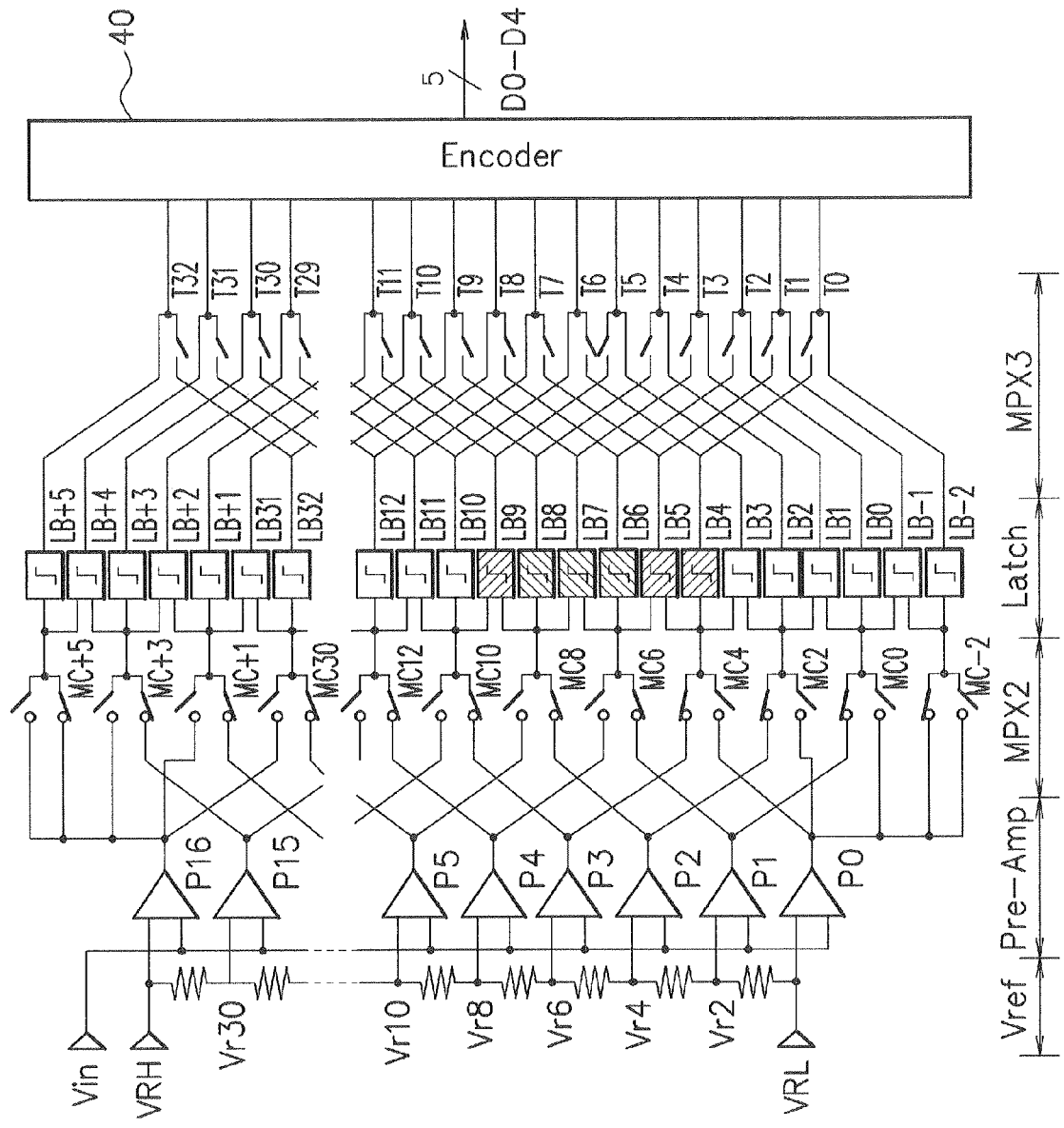
FIG. 4 is a diagram depicting a structural example of a parallel-type ADC according to a second embodiment.

FIG. 4 is a diagram depicting a structural example of a parallel-type ADC to which an analog signal processing device according to the second embodiment is applied. The parallel-type ADC in the second embodiment converts an inputted analog input signal Vin into a 5-bit digital signal D0-D4.

In FIG. 4, Vref denotes a reference voltage generating unit generating plural comparison reference voltages based on a reference voltage. The reference voltage generating unit Vref divides the voltage between a voltage VRH and a voltage VRL (by resistors in this embodiment) to generate comparison reference voltages VRL (Vr0), Vr2, Vr4, ..., Vr30, VRH (Vr32).

Pre-Amp denotes a preamplifier unit to which the comparison reference voltages Vr0, Vr2, ..., Vr32 generated by the reference voltage generating unit Vref and the analog input signal Vin are inputted. The preamplifier unit Pre-Amp is formed by plural preamplifiers P0, P1, ..., P16 which arithmetically process an inputted comparison reference voltage and the analog input signal Vin. To each of the preamplifiers P0, P1, ..., P16, a comparison reference voltage and the analog input signal Vin are inputted and arithmetically processed therein, and an obtained differential voltage between the comparison reference voltage and the analog input signal Vin is amplified and outputted.

MPX2 denotes a connecting unit controlling connections between the preamplifiers P0, P1, ..., P16 forming the preamplifier unit Pre-Amp and latches LB−2, LB−1, LB0, LB1, ..., LB+5 forming a latch unit Latch. The connecting unit MPX2 is formed by a multiplexer having plural switches MC−2, MC−1, MC0, MC1, ..., MC+5.

The latch unit Latch is for judging a value of '1' or '0' at last. The latch unit Latch is formed by plural latches LB−2, LB−1, LB0, LB1, ..., LB+5, and each of the latches LB−2, LB−1, LB0, LB1, ..., LB+5 has at least one or more judgment points for the comparison reference voltages and outputs a judgment result.

MPX3 is a connecting unit controlling connections between the latches LB−2, LB−1, LB0, LB1, ..., LB+5 forming the latch unit Latch and inputs T0, T1, ..., T32 of an encoder 40. The encoder 40 encodes outputs T0, T1, ..., T32 from the latch unit Latch and outputs a digital signal D0-D4.

One structural example of the latch having the latch unit Latch is depicted in FIG. 5. Further, actual calibration setting in the latch unit Latch in the parallel-type ADC depicted in FIG. 4 is depicted in Table 2. In Table 2, connections between the latches LB−2, LB−1, LB0, LB1, ..., LB+5 and the inputs T0, T1, ..., T32 of the encoder 40 are depicted. Note that in Table 2, "Cal" indicates that calibration is performed, and "NC" indicates a non-connecting state.

TABLE 2

| | | State | | | | | | | | | | | |
|---|---|---|---|---|---|---|---|---|---|---|---|---|---|
| Latch | Init. | S0 | S1 | S2 | S3 | S4 | S5 | S6 | ... | S17 | S18 | S19 | S20 |
| LB + 5 | *Cal.* | T32 | T32 | T32 | T32 | T32 | T32 | T32 | | T32 | T32 | T32 | *Cal.* |
| LB + 4 | *Cal.* | T31 | T31 | T31 | T31 | T31 | T31 | T31 | | T31 | T31 | NC | *Cal.* |
| LB + 3 | *Cal.* | T30 | T30 | T30 | T30 | T30 | T30 | T30 | | T30 | T30 | *Cal.* | *Cal.* |
| LB + 2 | *Cal.* | T29 | T29 | T29 | T29 | T29 | T29 | T29 | | T29 | NC | *Cal.* | NC |
| LB + 1 | *Cal.* | T28 | T28 | T28 | T28 | T28 | T28 | T28 | | T28 | *Cal.* | *Cal.* | NC |
| LB31 | *Cal.* | T27 | T27 | T27 | T27 | T27 | T27 | T27 | | NC | *Cal.* | NC | NC |
| LB30 | *Cal.* | T26 | T26 | T26 | T26 | T26 | T26 | T26 | | *Cal.* | *Cal.* | NC | T32 |
| LB29 | *Cal.* | T25 | T25 | T25 | T25 | T25 | T25 | T25 | | *Cal.* | NC | T31 | T31 |
| LB9 | *Cal.* | T5 | T5 | T5 | T5 | T5 | T5 | NC | | T11 | T11 | T11 | T11 |
| LB8 | *Cal.* | T4 | T4 | T4 | T4 | T4 | T4 | *Cal.* | | T10 | T10 | T10 | T10 |
| LB7 | *Cal.* | T3 | T3 | T3 | T3 | T3 | NC | *Cal.* | | T9 | T9 | T9 | T9 |

TABLE 2-continued

| Latch | | | | | | | | | | | | |
|---|---|---|---|---|---|---|---|---|---|---|---|---|
| LB6 | Cal. | T2 | T2 | T2 | T2 | T2 | Cal. | Cal. | T8 | T8 | T8 | T8 |
| LB5 | Cal. | T1 | T1 | T1 | T1 | NC | Cal. | NC | T7 | T7 | T7 | T7 |
| LB4 | Cal. | T0 | T0 | T0 | T0 | Cal. | Cal. | NC | T6 | T6 | T6 | T6 |
| LB3 | Cal. | NC | NC | NC | NC | Cal. | NC | T5 | T5 | T5 | T5 | T5 |
| LB2 | Cal. | NC | NC | NC | Cal. | Cal. | NC | T4 | T4 | T4 | T4 | T4 |
| LB1 | Cal. | NC | NC | NC | Cal. | NC | T3 | T3 | T3 | T3 | T3 | T3 |
| LB0 | Cal. | NC | NC | Cal. | Cal. | NC | T2 | T2 | T2 | T2 | T2 | T2 |
| LB − 1 | Cal. | NC | NC | Cal. | NC | T1 | T1 | T1 | T1 | T1 | T1 | T1 |
| LB − 2 | Cal. | NC | Cal. | Cal. | NC | T0 | T0 | T0 | T0 | T0 | T0 | T0 |

| | State | | | | | | | | | | | |
|---|---|---|---|---|---|---|---|---|---|---|---|---|
| Latch | S21 | S22 | S23 | S24 | S25 | ... | S35 | S36 | S37 | S38 | S0 | S1 | S2 |

| Latch | S21 | S22 | S23 | S24 | S25 | S35 | S36 | S37 | S38 | S0 | S1 | S2 |
|---|---|---|---|---|---|---|---|---|---|---|---|---|
| LB + 5 | Cal. | NC | Cal. | Cal. | T32 | T32 | T32 | T32 | T32 | T32 | T32 | T32 |
| LB + 4 | NC | NC | NC | Cal. | NC | T31 | T31 | T31 | T31 | T31 | T31 | T31 |
| LB + 3 | NC | NC | NC | Cal. | Cal. | T30 | T30 | T30 | T30 | T30 | T30 | T30 |
| LB + 2 | NC | NC | NC | NC | Cal. | T29 | T29 | T29 | T29 | T29 | T29 | T29 |
| LB + 1 | NC | NC | NC | NC | Cal. | T28 | T28 | T28 | T28 | T28 | T28 | T28 |
| LB31 | NC | NC | NC | NC | NC | T27 | T27 | T27 | T27 | T27 | T27 | T27 |
| LB30 | T32 | T32 | T32 | T32 | NC | T26 | T26 | T26 | T26 | T26 | T26 | T26 |
| LB29 | T31 | T31 | T31 | T31 | T31 | T25 | T25 | T25 | T25 | T25 | T25 | T25 |
| LB9 | T11 | T11 | T11 | T11 | T11 | T5 | T5 | T5 | T5 | T5 | T5 | T5 |
| LB8 | T10 | T10 | T10 | T10 | T10 | T4 | T4 | T4 | T4 | T4 | T4 | T4 |
| LB7 | T9 | T9 | T9 | T9 | T9 | T3 | T3 | T3 | T3 | T3 | T3 | T3 |
| LB6 | T8 | T8 | T8 | T8 | T8 | T2 | T2 | T2 | T2 | T2 | T2 | T2 |
| LB5 | T7 | T7 | T7 | T7 | T7 | NC | T1 | T1 | T1 | T1 | T1 | T1 |
| LB4 | T6 | T6 | T6 | T6 | T6 | Cal. | T0 | T0 | T0 | T0 | T0 | T0 |
| LB3 | T5 | T5 | T5 | T5 | T5 | Cal. | NC | NC | NC | NC | NC | NC |
| LB2 | T4 | T4 | T4 | T4 | T4 | Cal. | Cal. | NC | NC | NC | NC | NC |
| LB1 | T3 | T3 | T3 | T3 | T3 | NC | Cal. | NC | NC | NC | NC | NC |
| LB0 | T2 | T2 | T2 | T2 | T2 | NC | Cal. | Cal. | NC | NC | NC | Cal. |
| LB − 1 | T1 | T1 | T1 | T1 | T1 | T1 | NC | Cal. | NC | NC | NC | Cal. |
| LB − 2 | T0 | T0 | T0 | T0 | T0 | T0 | NC | Cal. | Cal. | NC | Cal. | Cal. |

The state depicted in FIG. 4 corresponds to the state 56 depicted in Table 2.

The calibration performed in a latch is for cancelling the offset of a latch that actually performs interpolation. For the latch in which calibration is performed, its connection with the preamplifiers P0 to P16 is cut off to create a state depicted in FIG. 5, and thereby the offset of the latch itself is cancelled.

While the calibration of the latch is performed, switches SW31, SW32, SW33x, and SW34x are closed, and the switches SW33, SW34 are opened. Thus, amplification is performed by creating a state that a first voltage V31 is received by gates of both MOS transistors M45, M46 of the differential stage, and simultaneously the amplified voltages are recorded in capacitors C41, C42. Here, as the first voltage V31, a common mode potential (Vcm) may be used for example.

Next, the switches SW31, SW32, SW33x, SW34x are opened and the switches SW33, SW34 are closed, and thereby the voltages thereof are retained in the capacitors C41, C42. The MOS transistors M43, M44 perform amplification processing related to preamplifier outputs A31, A32, and the result is outputted as an output Vout according to the preamplifier outputs A31, A32.

When calibration of latches is performed, for latches (LB4, LB5, LB9 in the example depicted in FIG. 4) adjacent to the latches in which the calibration is performed (LB6, LB7, LB8 similarly), their connections with the preamplifiers are cut off simultaneously and their outputs are excluded by the connecting unit MPX3 provided between the encoder 40 and the latch unit Latch. Accordingly, it becomes possible to perform a normal operation while calibrating the latches.

Third Embodiment

Next, a third embodiment will be explained.

Figure 6:
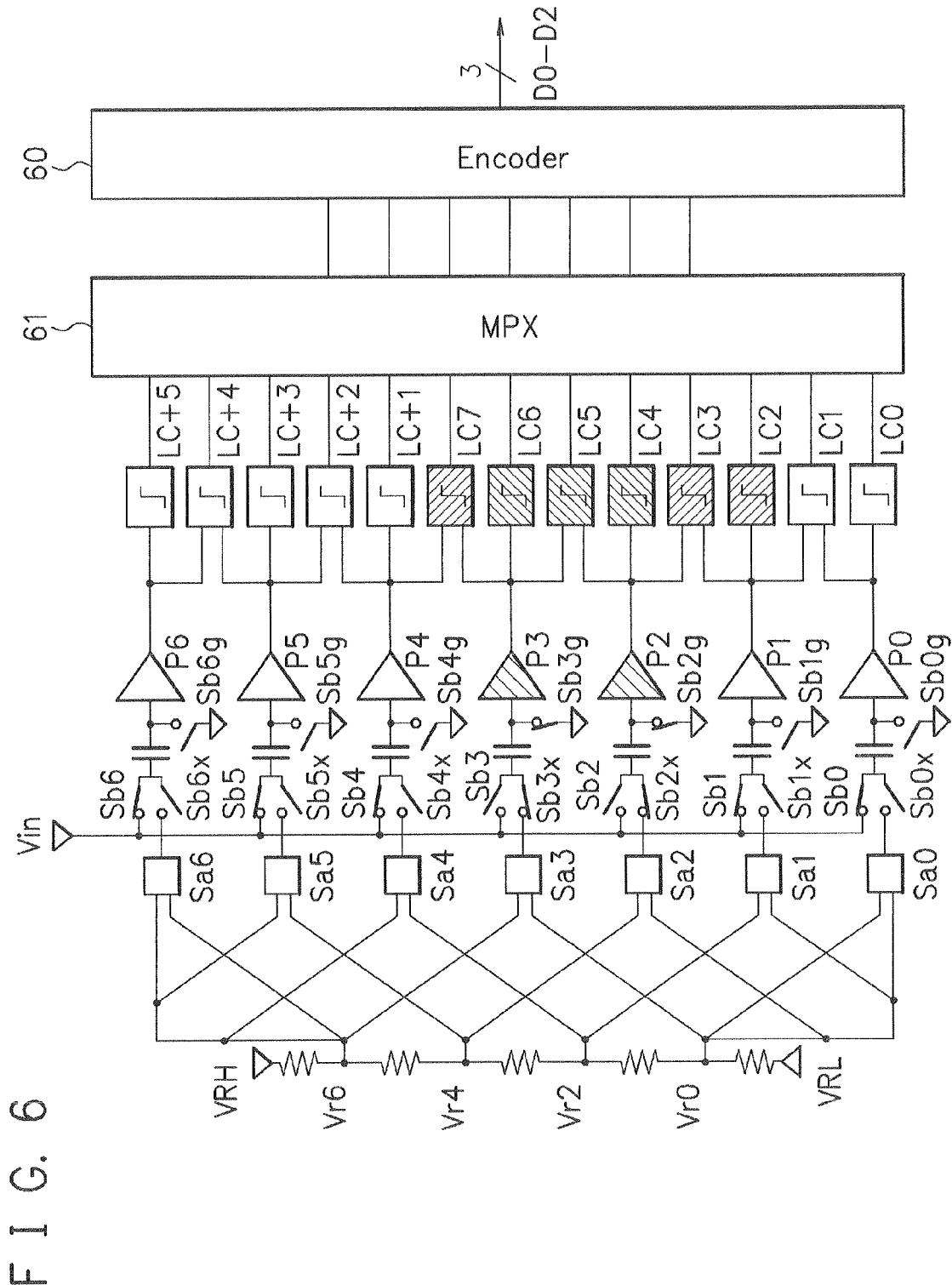
FIG. 6 is a diagram depicting a structural example of a parallel-type ADC according to a third embodiment.

FIG. 6 is a diagram depicting a structural example of a parallel-type ADC to which an analog signal processing device according to the third embodiment is applied. The parallel-type ADC in the third embodiment converts an inputted analog input signal Vin into a 3-bit digital signal D0-D2. Note that in FIG. 6, a description with a single end structure is given.

In FIG. 6, Sa0 to Sa6 denote switches, which select and output comparison reference voltages Vr0, Vr2, ..., Vr6 obtained by dividing the voltage between a voltage VRH and a voltage VRL.

The capacitor (capacitance value C) connected to a preamplifier Pi (i=0 to 6) is supplied with an analog input signal Vin via a switch Sbi during a normal operation, and is supplied with a comparison reference voltage Vref via a switch Sbix during calibration.

During calibration, the node between a capacitor and a preamplifier Pi is grounded (ground potential) by a switch Sbig, and thereby a charge of C (Vref-GND) is charged in the capacitor. Thereafter, the node between the capacitor and the preamplifier is cut off from the ground by turning off the switch Sbig, and thereby the charge between the capacitor and the preamplifier is retained. Consequently, the comparison reference voltage Vref is stored in the capacitor.

Further, during calibration, the preamplifier Pi amplifies the ground potential and transmits it to a latch LC. Based on this value, by performing offset canceling similarly to the second embodiment, the latch sets as a threshold voltage the output of the preamplifier when the ground potential is inputted.

As above, the offset from the preamplifier Pi to the latch LC is canceled. Furthermore, in a normal operation state thereafter, the analog input signal Vin is supplied to the capacitor, and thereby the differential voltage (Vref−Vin) is transmitted to the preamplifier. Thus, a comparison operation of the stored comparison reference voltage Vref and the analog input signal Vin is realized.

Note that in FIG. 6, numeral 61 denotes a connecting unit controlling connections between latches LC and inputs of an encoder 60, and numeral 60 denotes an encoder which encodes outputs from the latches and outputs a digital signal D0-D2.

Actual calibration setting in the parallel-type ADC depicted in FIG. 6 is depicted in Table 3. In Table 3, the comparison reference voltages inputted to the preamplifiers P0 to P6, states of the preamplifiers P0 to P6, and judgment points of latches LC0, LC1, . . . , LC+5 are depicted. Note that in Table 3, italic letters indicate that calibration is performed, bold letters indicate ones in a non-connecting state, and particularly, letters "x" indicate invalid ones. Further, underlined ones indicate virtual comparison reference voltages. The states depicted in FIG. 6 correspond to the state S3 depicted in Table 3.

connections between latches LD and inputs of an encoder 70, and numeral 70 denotes an encoder which encodes outputs from the latches and outputs a digital signal D0-D2.

The parallel-type ADC according to the fourth embodiment is made by further providing a gain correcting function in the parallel-type ADC in the third embodiment, and operation setting thereof is depicted in Table 4 to Table 7. Table 4 to Table 7 depict states of control signals for controlling on and off of switches or the like, comparison reference voltages to be inputted to preamplifiers P0 to P6, judgment points of latches LD0 to LD12, and the like. More particularly, Table 4 and Table 6 depict the control signals, and Table 5 and Table 7 depict the comparison reference voltages to be inputted to the preamplifiers P0 to P6, the judgment points of the latches LD0 to LD12, and the like.

Note that Table 4 and Table 5 depict an initial state to a state S8 (S8'), and Table 6 and Table 7 depict a subsequent state S9 and thereafter. In Table 4 to Table 7, italic letters correspond to ones in calibration, bold letters correspond to ones in a non-connecting state, and particularly, letters "x" indicate invalid ones. Further, ones in parentheses indicate that the

TABLE 3

| Part | Init. | S0 | S1 | S2 | S3 | S4 | S5 | S6 | S7 | S8 | S9 | S10 | S11 | S12 | S13 | S0 | S1 |
|---|---|---|---|---|---|---|---|---|---|---|---|---|---|---|---|---|---|
| Pre-Amp |
| P6 | *Vr6* | Vr6 | Vr6 | Vr6 | Vr6 | Vr6 | Vr6 | Vr6 | Vr6 | Vr6 | Vr6 | Vr6 | Vr6 | Vr6 | Vr6 | Vr6 | Vr6 |
| P5 | *Vr4* | Vr4 | Vr4 | Vr4 | Vr4 | Vr4 | Vr4 | *Vr6* | *Vr6* | *Vr6* | *Vr4* | *Vr4* | Vr4 | Vr4 | Vr4 | Vr4 | Vr4 |
| P4 | *Vr2* | Vr2 | Vr2 | Vr2 | Vr2 | Vr2 | *Vr6* | *Vr6* | *Vr6* | *Vr6* | *Vr6* | *Vr2* | *Vr2* | Vr2 | Vr2 | Vr2 | Vr2 |
| P3 | *Vr0* | Vr0 | Vr0 | Vr0 | *Vr6* | *Vr6* | *Vr6* | *Vr6* | *Vr6* | *Vr6* | *Vr6* | *Vr0* | *Vr0* | Vr0 | Vr0 | Vr0 | Vr0 |
| P2 | *Vr0* | Vr0 | Vr0 | *Vr4* | *Vr4* | Vr4 | Vr4 | Vr4 | Vr4 | Vr4 | Vr4 | Vr4 | *Vr0* | *Vr0* | Vr0 | Vr0 | Vr0 |
| P1 | *Vr0* | Vr0 | *Vr2* | *Vr2* | Vr2 | Vr2 | Vr2 | Vr2 | Vr2 | Vr2 | Vr2 | Vr2 | Vr2 | *Vr0* | *Vr0* | Vr0 | *Vr2* |
| P0 | *Vr0* | *Vr0* | *Vr0* | Vr0 | Vr0 | Vr0 | Vr0 | Vr0 | Vr0 | Vr0 | Vr0 | Vr0 | Vr0 | Vr0 | *Vr0* | *Vr0* | *Vr0* |
| Latch |
| LC + 5 | x | Vr6 | Vr6 | Vr6 | Vr6 | Vr6 | Vr6 | Vr6 | Vr6 | Vr6 | Vr6 | Vr6 | Vr6 | Vr6 | Vr6 | Vr6 | Vr6 |
| LC + 4 | x | <u>Vr5</u> | <u>Vr5</u> | <u>Vr5</u> | <u>Vr5</u> | <u>Vr5</u> | x | <u>Vr6</u> | x | <u>Vr5</u> | x | <u>Vr5</u> | <u>Vr5</u> | <u>Vr5</u> | <u>Vr5</u> | <u>Vr5</u> | <u>Vr5</u> |
| LC + 3 | x | Vr4 | Vr4 | Vr4 | Vr4 | Vr4 | *Vr6* | *Vr6* | Vr6 | *Vr4* | *Vr4* | Vr4 | Vr4 | Vr4 | Vr4 | Vr4 | Vr4 |
| LC + 2 | x | <u>Vr3</u> | <u>Vr3</u> | <u>Vr3</u> | <u>Vr3</u> | x | <u>*Vr6*</u> | x | Vr6 | x | <u>Vr3</u> | x | <u>Vr3</u> | <u>Vr3</u> | <u>Vr3</u> | <u>Vr3</u> | <u>Vr3</u> |
| LC + 1 | x | Vr2 | Vr2 | Vr2 | Vr2 | *Vr6* | *Vr6* | Vr6 | Vr6 | Vr6 | *Vr2* | *Vr2* | Vr2 | Vr2 | Vr2 | Vr2 | Vr2 |
| LC7 | x | <u>Vr1</u> | <u>Vr1</u> | <u>Vr1</u> | x | <u>*Vr6*</u> | x | Vr6 | Vr6 | Vr6 | x | <u>*Vr1*</u> | x | <u>Vr1</u> | <u>Vr1</u> | <u>Vr1</u> | <u>Vr1</u> |
| LC6 | x | Vr0 | Vr0 | Vr0 | *Vr6* | *Vr6* | Vr6 | Vr6 | Vr6 | Vr6 | Vr6 | *Vr0* | *Vr0* | Vr0 | Vr0 | Vr0 | Vr0 |
| LC5 | x | Vr0 | Vr0 | x | <u>*Vr5*</u> | x | <u>Vr5</u> | <u>Vr5</u> | <u>Vr5</u> | <u>Vr5</u> | <u>Vr5</u> | x | <u>*Vr0*</u> | x | Vr0 | Vr0 | Vr0 |
| LC4 | x | Vr0 | Vr0 | *Vr4* | *Vr4* | Vr4 | Vr4 | Vr4 | Vr4 | Vr4 | Vr4 | Vr4 | *Vr0* | *Vr0* | Vr0 | Vr0 | Vr0 |
| LC3 | x | Vr0 | x | <u>*Vr3*</u> | x | <u>Vr3</u> | <u>Vr3</u> | <u>Vr3</u> | <u>Vr3</u> | <u>Vr3</u> | <u>Vr3</u> | <u>Vr3</u> | x | <u>*Vr0*</u> | x | Vr0 | x |
| LC2 | X | Vr0 | *Vr2* | *Vr2* | Vr2 | Vr2 | Vr2 | Vr2 | Vr2 | Vr2 | Vr2 | Vr2 | Vr2 | *Vr0* | *Vr0* | Vr0 | *Vr2* |
| LC1 | x | x | <u>*Vr1*</u> | x | <u>Vr1</u> | <u>Vr1</u> | <u>Vr1</u> | <u>Vr1</u> | <u>Vr1</u> | <u>Vr1</u> | <u>Vr1</u> | <u>Vr1</u> | <u>Vr1</u> | x | <u>*Vr0*</u> | x | <u>*Vr1*</u> |
| LC0 | x | *Vr0* | *Vr0* | Vr0 | Vr0 | Vr0 | Vr0 | Vr0 | Vr0 | Vr0 | Vr0 | Vr0 | Vr0 | Vr0 | Vr0 | *Vr0* | *Vr0* |

Fourth Embodiment

Next, a fourth embodiment will be explained.

FIG. 7 is a diagram depicting a structural example of a parallel-type ADC to which an analog signal processing device according to the fourth embodiment is applied. The parallel-type ADC in the fourth embodiment converts an inputted analog input signal Vin into a 3-bit digital signal D0-D2. Numeral 71 denotes a connecting unit controlling gain is not adjusted, and underlined ones indicate virtual comparison reference voltages.

Further, in the control signals in Table 4 to Table 7, "H" indicates a state that the corresponding switch is closed, and "L" indicates a state that the corresponding switch is opened. Furthermore, when there is a switch in a complementary relationship which is added a suffix "x" for a switch corresponding to a control signal, the switch in a complementary relationship is opened at "H" and closed at "L".

TABLE 4

| Part | | Init. | S0 | S0' | S1 | S1' | S2 | S2' | S3 | S3' | S4 | S4' | S5 | S5' | S6 | S6' | S7 | S7' | S8 | S8' |
|---|---|---|---|---|---|---|---|---|---|---|---|---|---|---|---|---|---|---|---|---|
| Vref | Sd | L | H | H | H | H | H | H | H | H | H | H | H | H | H | H | H | H | L | L |
| Gain Cal. | Sg7 | L | L | L | L | L | L | L | L | L | L | L | L | L | L | L | *H* | L | *H* | H |
| Ref. | Sg6 | L | L | L | L | L | L | L | L | L | L | L | L | L | *H* | L | L | *H* | L | L |
| | Sg5 | L | L | L | L | L | L | L | L | L | L | L | *H* | L | L | *H* | L | L | L | L |
| | Sg4 | L | L | L | L | L | L | L | L | L | *H* | L | *H* | L | L | L | L | L | L | L |
| | Sg3 | L | L | L | L | L | L | L | *H* | L | L | *H* | L | L | L | L | L | L | L | L |
| | Sg2 | L | L | L | L | L | *H* | L | L | *H* | L | L | L | L | L | L | L | L | L | L |
| | Sg1 | L | L | L | *H* | L | L | *H* | L | L | L | L | L | L | L | L | L | L | L | L |
| | Sg0 | *H* | *H* | *H* | L | *H* | L | L | L | L | L | L | L | L | L | L | L | L | L | L |
| Gain Cal. | Sc6 | H | L | L | L | L | L | L | L | L | L | L | L | L | L | L | *H* | L | L | L |
| Comp. | Sc5 | H | L | L | L | L | L | L | L | L | L | L | L | L | *H* | L | L | L | L | L |
| | Sc4 | H | L | L | L | L | L | L | L | L | L | L | *H* | L | L | L | L | L | L | L |
| | Sc3 | H | L | L | L | L | L | L | L | L | *H* | L | L | L | L | L | L | L | L | L |
| | Sc2 | H | L | L | L | L | L | L | *H* | L | L | L | L | L | L | L | L | L | L | L |
| | Sc1 | H | L | L | L | L | L | *H* | L | L | L | L | L | L | L | L | L | L | L | L |
| | Sc0 | H | L | L | L | *H* | L | L | L | L | L | L | L | L | L | L | L | L | L | L |
| Vin Ref | Sz6 | L | H | H | H | H | H | H | H | H | H | H | H | *L* | *L* | *L* | *L* | *L* | *L* | *L* |
| Selector | Sz5 | L | H | H | H | H | H | H | H | H | H | H | *L* | *L* | *L* | *L* | H | H | H | H |
| | Sz4 | L | H | H | H | H | H | H | H | H | *L* | *L* | *L* | *L* | H | H | H | H | H | H |
| | Sz3 | L | H | H | H | H | H | H | *L* | *L* | *L* | *L* | H | H | H | H | H | H | H | H |
| | Sz2 | L | H | H | H | H | *L* | *L* | *L* | *L* | H | H | H | H | H | H | H | H | H | H |
| | Sz1 | L | H | H | *L* | *L* | *L* | *L* | H | H | H | H | H | H | H | H | H | H | H | H |
| | Sz0 | L | *L* | *L* | *L* | *L* | H | H | H | H | H | H | H | H | H | H | H | H | H | H |
| Vcm Bias | Sz6g | H | L | L | L | L | L | L | L | L | L | L | L | L | *H* | *H* | *H* | L | *H* | *H* |
| | Sz5g | H | L | L | L | L | L | L | L | L | L | L | *H* | *H* | *H* | L | L | L | L | L |
| | Sz4g | H | L | L | L | L | L | L | L | L | *H* | *H* | *H* | L | L | L | L | L | L | L |
| | Sz3g | H | L | L | L | L | L | L | *H* | *H* | *H* | L | L | L | L | L | L | L | L | L |
| | Sz2g | H | L | L | L | L | *H* | *H* | *H* | L | L | L | L | L | L | L | L | L | L | L |
| | Sz1g | H | L | L | *H* | *H* | *H* | L | L | L | L | L | L | L | L | L | L | L | L | L |
| | Sz0g | H | *H* | *H* | *H* | L | L | L | L | L | L | L | L | L | L | L | L | L | L | L |
| Feed | Sf6 | *H* | L | L | L | L | L | L | L | L | L | L | L | L | L | L | *H* | L | L | L |
| Back | Sf5 | *H* | L | L | L | L | L | L | L | L | L | L | L | L | L | *H* | L | L | L | L |
| | Sf4 | *H* | L | L | L | L | L | L | L | L | L | L | *H* | L | L | L | L | L | L | L |
| | Sf3 | *H* | L | L | L | L | L | L | L | L | *H* | L | L | L | L | L | L | L | L | L |
| | Sf2 | *H* | L | L | L | L | L | L | *H* | L | L | L | L | L | L | L | L | L | L | L |
| | Sf1 | *H* | L | L | L | L | *H* | L | L | L | L | L | L | L | L | L | L | L | L | L |
| | Sf0 | *H* | L | L | L | *H* | L | L | L | L | L | L | L | L | L | L | L | L | L | L |
| Comp. | So6 | L | L | L | L | L | L | L | L | L | L | L | L | L | L | L | *H* | *H* | *H* | *H* |
| out | So5 | L | L | L | L | L | L | L | L | L | L | L | L | *H* | *H* | L | L | L | L | L |
| | So4 | L | L | L | L | L | L | L | L | L | L | *H* | *H* | L | L | L | L | L | L | L |
| | So3 | L | L | L | L | L | L | L | L | *H* | *H* | L | L | L | L | L | L | L | L | L |
| | So2 | L | L | L | L | L | L | L | *H* | *H* | L | L | L | L | L | L | L | L | L | L |
| | So1 | L | L | L | L | L | *H* | *H* | L | L | L | L | L | L | L | L | L | L | L | L |
| | So0 | *H* | *H* | *H* | *H* | *H* | L | L | L | L | L | L | L | L | L | L | L | L | L | L |

TABLE 5

| Part | | Init. | S0 | S0' | S1 | S1' | S2 | S2' | S3 | S3' | S4 | S4' |
|---|---|---|---|---|---|---|---|---|---|---|---|---|
| Pre-Amp | P6 | *Vr6* | | (Vr6) | | (Vr6) | | (Vr6) | | (Vr6) | | (Vr6) |
| Vref | P5 | *Vr4* | | (Vr4) | | (Vr4) | | (Vr4) | | (Vr4) | | (Vr4) |
| | P4 | *Vr2* | | (Vr2) | | (Vr2) | | (Vr2) | | (Vr2) | | (Vr2) |
| | P3 | *VRL* | | (VRL) | | (VRL) | | (VRL) | *Vr6* | x | *Vr6* | *VRH* |
| | P2 | *VRL* | | (VRL) | | (VRL) | *Vr4* | x | *Vr4* | *Vr6* | *Vr4* | |
| | P1 | *VRL* | | (VRL) | *Vr2* | x | *Vr2* | *Vr4* | *Vr2* | | *Vr2* | |
| | P0 | *VRL* | *VRL* | x | *VRL* | *Vr2* | *VRL* | | *VRL* | | *VRL* | |
| Latch | LD12 | x | | (Vr6) | | (Vr6) | | (Vr6) | | (Vr6) | | (Vr6) |
| Judgement | LD11 | x | | <u>Vr5</u> | | <u>Vr5</u> | | <u>Vr5</u> | | <u>Vr5</u> | | <u>Vr5</u> |
| | LD10 | x | | (Vr4) | | (Vr4) | | (Vr4) | | (Vr4) | | (Vr4) |
| | LD9 | x | | <u>Vr3</u> | | <u>Vr3</u> | | <u>Vr3</u> | | <u>Vr3</u> | x | x |
| | LD8 | x | | (Vr2) | | (Vr2) | | (Vr2) | | (Vr2) | *VRH* | x |
| | LD7 | x | | <u>Vr1</u> | | <u>Vr1</u> | | <u>Vr1</u> | x | x | *VRH* | x |
| | LD6 | x | | (VRL) | | (VRL) | | (VRL) | *VRH* | x | *VRH* | x |
| | LD5 | x | | <u>VRL</u> | | <u>VRL</u> | x | x | *Vr5* | x | x | x |
| | LD4 | x | | (VRL) | | (VRL) | *Vr4* | x | *Vr4* | x | Vr4 | |
| | LD3 | x | | VRL | x | x | *Vr3* | x | x | x | <u>Vr3</u> | |
| | LD2 | x | | (VRL) | *Vr2* | x | *Vr2* | x | *Vr2* | | <u>Vr2</u> | |
| | LD1 | x | x | x | *Vr1* | x | X | x | <u>Vr1</u> | | <u>Vr1</u> | |
| | LD0 | x | *VRL* | x | *VRL* | x | VRL | | *VRL* | | *VRL* | |

TABLE 5-continued

| Gain CNTL Block | Szz | H | H | L | H | L | H | L | H | L | H | L |
|---|---|---|---|---|---|---|---|---|---|---|---|---|
| | SWz | H | H | L | H | L | H | L | H | L | H | L |
| | Isg | VRL | VRL | VRL | Vr2 | VRL | Vr4 | Vr2 | Vr6 | Vr4 | VRH | Vr6 |
| | Iso | P0 | | | P0 | | P1 | | P2 | | P3 | |

| | | State | | | | | | | |
|---|---|---|---|---|---|---|---|---|---|
| Part | | S5 | S5' | S6 | S6' | S7 | S7' | S8 | S8' |
| Pre-Amp Vref | P6 | (Vr6) | *Vr6* | *Vr6* | x | *Vr6* | VRH | *Vr6* | x |
| | P5 | *Vr6* | x | *Vr6* | VRH | VRH | | VRH | |
| | P4 | *Vr6* | VRH | VRH | | VRH | | VRH | |
| | P3 | Vr6 | | Vr6 | | Vr6 | | Vr6 | |
| | P2 | Vr4 | | Vr4 | | Vr4 | | Vr4 | |
| | P1 | Vr2 | | Vr2 | | Vr2 | | Vr2 | |
| | P0 | VRL | | VRL | | VRL | | VRL | |
| Latch Judgement | LD12 | (Vr6) | *VRH* | *VRH* | x | *VRH* | x | *VRH* | x |
| | LD11 | x | x | *VRH* | x | x | x | x | x |
| | LD10 | *VRH* | x | *VRH* | x | VRH | | VRH | |
| | LD9 | *VRH* | x | x | x | VRH | | VRH | |
| | LD8 | *VRH* | x | VRH | | VRH | | VRH | |
| | LD7 | x | x | VRH | | VRH | | VRH | |
| | LD6 | VRH | | VRH | | VRH | | VRH | |
| | LD5 | Vr5 | | Vr5 | | Vr5 | | Vr5 | |
| | LD4 | Vr4 | | Vr4 | | Vr4 | | Vr4 | |
| | LD3 | Vr3 | | Vr3 | | Vr3 | | Vr3 | |
| | LD2 | Vr2 | | Vr2 | | Vr2 | | Vr2 | |
| | LD1 | Vr1 | | Vr1 | | Vr1 | | Vr1 | |
| | LD0 | VRL | | VRL | | VRL | | VRL | |
| Gain CNTL Block | Szz | H | L | H | L | H | L | H | L | | | |
| | SWz | H | L | H | L | H | L | H | v | | | |
| | Isg | VRH | VRH | VRH | VRH | VRH | VRH | Vr4 | Vr6 | | | |
| | Iso | | P4 | | P5 | | P6 | | | | | |

TABLE 6

| | | State | | | | | | | | | | | | | | | | | | | | | |
|---|---|---|---|---|---|---|---|---|---|---|---|---|---|---|---|---|---|---|---|---|---|---|---|
| Part | | S9 | S9' | S10 | S10' | S11 | S11' | S12 | S12' | S13 | S13' | S14 | S14' | S15 | S15' | S0 | S0' | S1 | S1' | S2 | S2' |
| Vref | Sd | L | L | L | L | L | L | L | L | L | L | L | L | L | L | H | H | H | H | … | … |
| Gain Cal. Ref. | Sg7 | *H* | L | L | L | L | L | L | L | L | L | L | L | L | L | L | L | L | L | … | … |
| | Sg6 | L | *H* | *H* | L | L | L | L | L | L | L | L | L | L | L | L | L | L | L | … | … |
| | Sg5 | L | L | L | *H* | *H* | L | L | L | L | L | L | L | L | L | L | L | L | L | … | … |
| | Sg4 | L | L | L | L | L | *H* | *H* | L | L | L | L | L | L | L | L | L | L | L | … | … |
| | Sg3 | L | L | L | L | L | L | L | *H* | *H* | L | L | L | L | L | L | L | L | L | … | … |
| | Sg2 | L | L | L | L | L | L | L | L | L | *H* | *H* | L | L | L | L | L | L | L | … | … |
| | Sg1 | L | L | L | L | L | L | L | L | L | L | L | *H* | *H* | L | L | L | *H* | L | … | … |
| | Sg0 | L | L | L | L | L | L | L | L | L | L | L | L | L | *H* | *H* | *H* | L | *H* | … | … |
| Gain Cal. Comp. | Sc6 | L | *H* | L | L | L | L | L | L | L | L | L | L | L | L | L | L | L | L | … | … |
| | Sc5 | L | L | L | *H* | L | L | L | L | L | L | L | L | L | L | L | L | L | L | … | … |
| | Sc4 | L | L | L | L | L | *H* | L | L | L | L | L | L | L | L | L | L | L | L | … | … |
| | Sc3 | L | L | L | L | L | L | L | *H* | L | L | L | L | L | L | L | L | L | L | … | … |
| | Sc2 | L | L | L | L | L | L | L | L | L | *H* | L | L | L | L | L | L | L | L | … | … |
| | Sc1 | L | L | L | L | L | L | L | L | L | L | L | *H* | L | L | L | L | L | L | … | … |
| | Sc0 | L | L | L | L | L | L | L | L | L | L | L | L | L | *H* | L | L | L | *H* | … | … |
| Vin Ref Selector | Sz6 | *L* | *L* | H | H | H | H | H | H | H | H | H | H | H | H | H | H | H | H | … | … |
| | Sz5 | *L* | *L* | *L* | *L* | H | H | H | H | H | H | H | H | H | H | H | H | H | H | … | … |
| | Sz4 | H | H | *L* | *L* | *L* | *L* | H | H | H | H | H | H | H | H | H | H | H | H | … | … |
| | Sz3 | H | H | H | H | *L* | *L* | *L* | *L* | H | H | H | H | H | H | H | H | H | H | … | … |
| | Sz2 | H | H | H | H | H | H | *L* | *L* | *L* | *L* | H | H | H | H | H | H | H | H | … | … |
| | Sz1 | H | H | H | H | H | H | H | H | *L* | *L* | *L* | *L* | H | H | H | H | *L* | *L* | … | … |
| | Sz0 | H | H | H | H | H | H | H | H | H | H | *L* | *L* | *L* | *L* | *L* | *L* | *L* | *L* | … | … |
| Vcm Bias | Sz6g | *H* | L | L | L | L | L | L | L | L | L | L | L | L | L | L | L | L | L | … | … |
| | Sz5g | *H* | *H* | L | L | L | L | L | L | L | L | L | L | L | L | L | L | L | L | … | … |
| | Sz4g | L | L | *H* | *H* | L | L | L | L | L | L | L | L | L | L | L | L | L | L | … | … |
| | Sz3g | L | L | L | L | *H* | *H* | *H* | L | L | L | L | L | L | L | L | L | L | L | … | … |
| | Sz2g | L | L | L | L | L | L | *H* | *H* | L | L | L | L | L | L | L | L | L | L | … | … |
| | Sz1g | L | L | L | L | L | L | L | L | *H* | *H* | *H* | L | L | L | L | L | *H* | *H* | … | … |
| | Sz0g | L | L | L | L | L | L | L | L | L | L | *H* | *H* | *H* | L | *H* | *H* | *H* | L | … | … |

TABLE 6-continued

| Part | | S9 | S9' | S10 | S10' | S11 | S11' | S12 | S12' | S13 | S13' | S14 | S14' | S15 | S15' | S0 | S0' | S1 | S1' | S2 | S2' |
|---|---|---|---|---|---|---|---|---|---|---|---|---|---|---|---|---|---|---|---|---|---|
| Feed | Sf6 | L | *H* | L | L | L | L | L | L | L | L | L | L | L | L | L | L | L | L | ... | ... |
| Back | Sf5 | L | L | L | *H* | L | L | L | L | L | L | L | L | L | L | L | L | L | L | ... | ... |
| | Sf4 | L | L | L | L | L | *H* | L | L | L | L | L | L | L | L | L | L | L | L | ... | ... |
| | Sf3 | L | L | L | L | L | L | L | *H* | L | L | L | L | L | L | L | L | L | L | ... | ... |
| | Sf2 | L | L | L | L | L | L | L | L | L | *H* | L | L | L | L | L | L | L | L | ... | ... |
| | Sf1 | L | L | L | L | L | L | L | L | L | L | L | *H* | L | L | L | L | L | L | ... | ... |
| | Sf0 | L | L | L | L | L | L | L | L | L | L | L | L | L | *H* | L | L | L | *H* | ... | ... |
| Comp. | So6 | *H* | *H* | L | L | L | L | L | L | L | L | L | L | L | L | L | L | L | L | ... | ... |
| out | So5 | L | L | *H* | *H* | L | L | L | L | L | L | L | L | L | L | L | L | L | L | ... | ... |
| | So4 | L | L | L | L | *H* | *H* | L | L | L | L | L | L | L | L | L | L | L | L | ... | ... |
| | So3 | L | L | L | L | L | L | *H* | *H* | L | L | L | L | L | L | L | L | L | L | ... | ... |
| | So2 | L | L | L | L | L | L | L | L | *H* | *H* | L | L | L | L | L | L | L | L | ... | ... |
| | So1 | L | L | L | L | L | L | L | L | L | L | *H* | *H* | L | L | L | L | L | L | ... | ... |
| | So0 | L | L | L | L | L | L | L | L | L | L | L | L | *H* | *H* | *H* | *H* | *H* | *H* | ... | ... |

TABLE 7

| Part | | S9 | S9' | S10 | S10' | S11 | S11' | S12 | S12' | S13 | S13' |
|---|---|---|---|---|---|---|---|---|---|---|---|
| Pre-Amp | P6 | *Vr6* | *VRH* | Vr6 | | Vr6 | | Vr6 | | Vr6 | |
| Vref | P5 | *Vr4* | x | *Vr4* | *Vr6* | Vr4 | | Vr4 | | Vr4 | |
| | P4 | VRH | | *Vr2* | x | Vr2 | *Vr4* | Vr2 | | Vr2 | |
| | P3 | Vr6 | | Vr6 | | *VRL* | X | *VRL* | *Vr2* | VRL | |
| | P2 | Vr4 | | Vr4 | | Vr4 | | *VRL* | x | *VRL* | *VRL* |
| | P1 | Vr2 | | Vr2 | | Vr2 | | Vr2 | | *VRL* | x |
| | P0 | VRL | | VRL | | VRL | | VRL | | VRL | |
| Latch | LD12 | *VRH* | x | Vr6 | | Vr6 | | Vr6 | | Vr6 | |
| Judgement | LD11 | *Vr5* | x | x | x | Vr5 | | Vr5 | | Vr5 | |
| | LD10 | *Vr4* | x | *Vr4* | x | Vr4 | | Vr4 | | Vr4 | |
| | LD9 | x | x | *Vr3* | x | x | x | Vr3 | | Vr3 | |
| | LD8 | VRH | | *Vr2* | x | *Vr2* | x | Vr2 | | Vr2 | |
| | LD7 | VRH | | x | x | *Vr1* | x | x | x | Vr1 | |
| | LD6 | VRH | | VRH | | *VRL* | x | *VRL* | x | VRL | |
| | LD5 | Vr5 | | Vr5 | | x | x | *VRL* | x | *VRL* | x |
| | LD4 | Vr4 | | Vr4 | | Vr4 | | *VRL* | x | *VRL* | x |
| | LD3 | Vr3 | | Vr3 | | Vr3 | | x | x | *VRL* | x |
| | LD2 | Vr2 | | Vr2 | | Vr2 | | Vr2 | | *VRL* | x |
| | LD1 | Vr1 | | Vr1 | | Vr1 | | Vr1 | | x | x |
| | LD0 | VRL | | VRL | | VRL | | VRL | | VRL | |
| Gain CNTL | Szz | H | L | H | L | H | L | H | L | H | L |
| Block | SWz | H | L | H | L | H | L | H | L | H | L |
| | Isg | VRH | Vr6 | VRL | Vr2 | VRL | VRL | VRL | VRL | VRL | VRL |
| | Iso | | P6 | | P5 | | P4 | | P3 | | P2 |

| Part | | S14 | S14' | S15 | S15' | S0 | S0' | S1 | S1' | S2 | S2' |
|---|---|---|---|---|---|---|---|---|---|---|---|
| Pre-Amp | P6 | Vr6 | | Vr6 | | Vr6 | | Vr6 | | ... | |
| Vref | P5 | Vr4 | | Vr4 | | Vr4 | | Vr4 | | ... | |
| | P4 | Vr2 | | Vr2 | | Vr2 | | Vr2 | | ... | |
| | P3 | VRL | | VRL | | VRL | | VRL | | ... | |
| | P2 | (VRL) | | (VRL) | | (VRL) | | (VRL) | | ... | |
| | P1 | *VRL* | *VRL* | (VRL) | | (VRL) | | Vr2 | x | ... | ... |
| | P0 | *VRL* | x | *VRL* | *VRL* | *VRL* | x | *VRL* | *Vr2* | ... | ... |
| Latch | LD12 | Vr6 | | Vr6 | | Vr6 | | Vr6 | | ... | |
| Judgement | LD11 | Vr5 | | Vr5 | | Vr5 | | Vr5 | | ... | |
| | LD10 | Vr4 | | Vr4 | | Vr4 | | Vr4 | | ... | |
| | LD9 | Vr3 | | Vr3 | | Vr3 | | Vr3 | | ... | |
| | LD8 | Vr2 | | Vr2 | | Vr2 | | Vr2 | | ... | |
| | LD7 | Vr1 | | Vr1 | | Vr1 | | Vr1 | | ... | |
| | LD6 | VRL | | VRL | | VRL | | VRL | | ... | |
| | LD5 | VRL | | VRL | | VRL | | VRL | | ... | |
| | LD4 | VRL | | VRL | | VRL | | VRL | | ... | |
| | LD3 | x | x | VRL | | VRL | | x | x | ... | ... |
| | LD2 | *VRL* | x | VRL | | VRL | | Vr2 | x | ... | ... |
| | LD1 | *VRL* | x | *VRL* | x | x | x | *Vr1* | x | ... | ... |
| | LD0 | *VRL* | x | *VRL* | x | *VRL* | x | *VRL* | x | ... | ... |

TABLE 7-continued

| Gain CNTL Block | Szz | H | L | H | L | H | L | H | L | ... | ... |
|---|---|---|---|---|---|---|---|---|---|---|---|
| | SWz | H | L | H | L | H | L | H | L | ... | ... |
| | Isg | VRL | VRL | Vr2 | VRL | Vr4 | Vr2 | Vr6 | Vr4 | ... | ... |
| | Iso | | P1 | | P0 | | | | P0 | ... | ... |

Hereinafter, a fourth embodiment will be explained with reference to FIG. 7.

For example, in the states S3 in Table 4 and Table 5, the preamplifiers P2, P3 perform offset canceling. A preamplifier output in a state that a comparison reference voltage Vr4 is inputted to the preamplifier P2 is transmitted as a signal So_IN to a gain control unit 72 via a switch So2 and stored therein. At this time, a reference circuit in the gain control unit 72 depicted in FIG. 8 similarly inputs a comparison reference voltage Vr6 as a signal Sg_IN via a switch Sg3, and an output thereof is stored in the gain control unit 72.

Next, a bias switch Sz2g of the preamplifier P2 to be subjected to gain correction is turned off to be in a comparison state. On and off of the switches Sc2, Sc2x are then switched to be inputs so as to input and amplify the adjacent comparison reference voltage Vr6, and an output thereof is transmitted to the gain control unit 72. At this time, the comparison reference voltage Vr4 is inputted to the reference circuit in the gain control unit 72 by the switch Sg3.

In the gain control unit 72, a differential voltage (Vr4−Vr6) amplified by the preamplifier P2 and a differential voltage (Vr6−Vr4) amplified by the reference circuit are compared, and based on the result of comparison, there is made a correction to work as a negative feedback to the part related to the gain of the preamplifier, thereby performing gain correction. In the fourth embodiment, gain correction with a common reference is performed for each preamplifier by thus using the common reference circuit.

Figure 8:
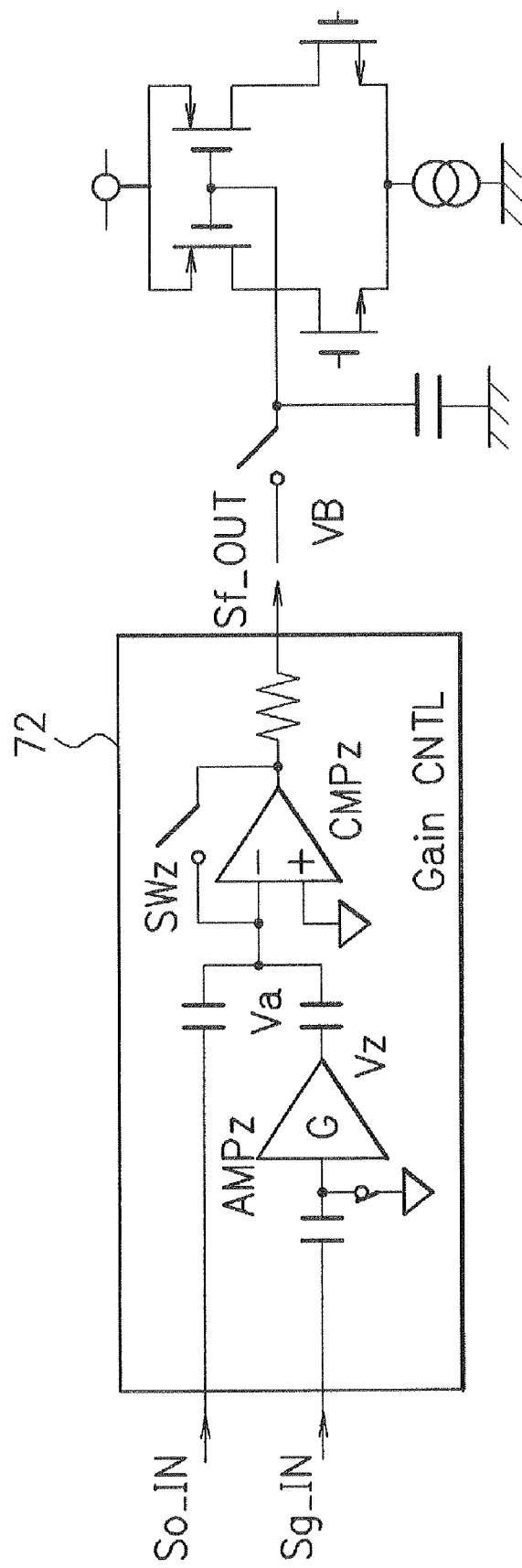
FIG. 8 is a diagram depicting a structural example of a gain control unit 72 depicted in FIG. 7.

FIG. 8 depicts a structural example of the gain control unit 72 depicted in FIG. 7.

In FIG. 8, the amplifier unit AMPz is structured including replicas identical to the preamplifier Pi, the switch Szig, and the capacitor depicted in FIG. 7. For example, in the state S3 in Table 4 and Table 5, the amplifier unit AMPz inputs the voltage Vr6 via the switch Sg3, and simultaneously the connection point between the capacitor and the AMPz is grounded. At this time, the comparison reference voltage Vr4 is inputted, which is then inputted to the capacitor in the gain control unit 72 via the switch So2 from an output of the preamplifier P2 grounded to the ground by the switch Sz2g. Based on outputs of the both, an amplifier CMPz cancels the offset similarly to an interpolation CMP, which will be explained later, by turning on a switch SWz.

Next, proceeding to the state S3', the switch SWz is turned off and the switch corresponding to the Szig is turned off, and the input of the amplifier unit AMPz is switched to the voltage Vr4 by the switch Sg2. Thus, the amplifier unit AMPz performs calculation of G(Vr4−Vr6) and outputs the result to one capacitor of the amplifier CMPz. Simultaneously, by switching from turning on of the switch Sc2x to turning on of the switch Sc2, the voltage Vr6 is inputted to the preamplifier P2 and amplified by gain G'. This output becomes G'(Vr6−Vr4) and is inputted to the other capacitor in the gain control unit 72 via the switch So2.

The amplifier CMPz judges a difference G(Vr4−Vr6)−G'(Vr6−Vr4) between voltage variations of both the capacitors. This difference corresponds namely to a difference of (G−G'), and the judgment result thereof is outputted. Based on the judgment result, by returning to the preamplifier P2 via a switch Sf2 so as to operate as a negative feedback to the part related to the gain of the preamplifier, the gain G' of the preamplifier P1 is corrected to be G'=G.

In FIG. 8, the result is returned to the gate of the PMOS load as a circuit example of the preamplifier. Since the gain control unit 72 is common to all the preamplifiers, even if there is an error, all the preamplifiers have the similar errors. Thus, errors originated in gain errors when interpolation is performed are cancelled.

Although the case where the gain control unit 72 is provided in the parallel-type ADC depicted in the third embodiment is described above, note that a gain control unit 91 may be provided in the parallel-type ADC shown in the first embodiment, as depicted in FIG. 9.

Figure 10:
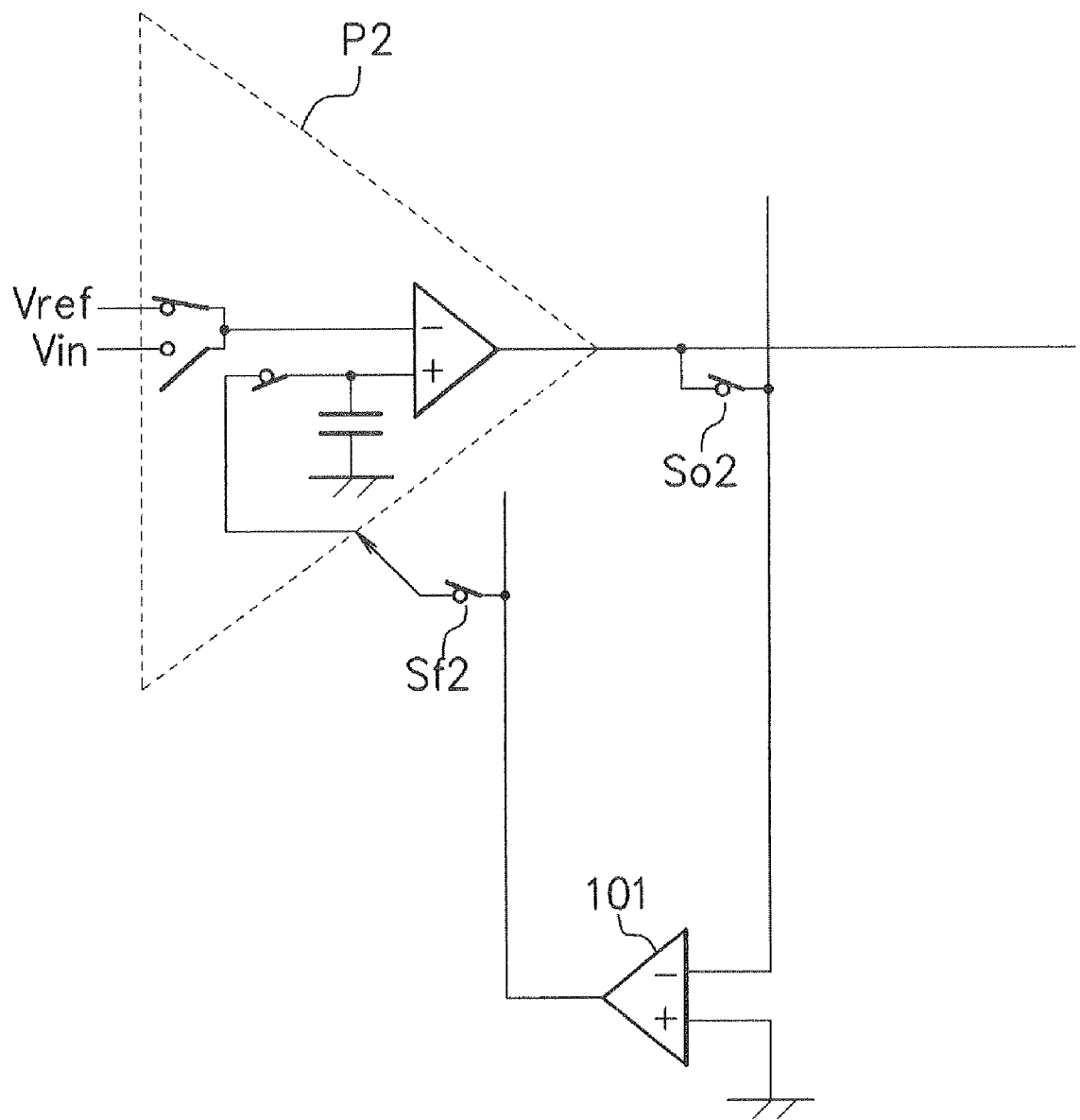
FIG. 10 is a diagram depicting a structural example of a preamplifier and a gain control unit in the case where the gain control unit is provided in the parallel-type ADC depicted in the first embodiment.
Figure 11:
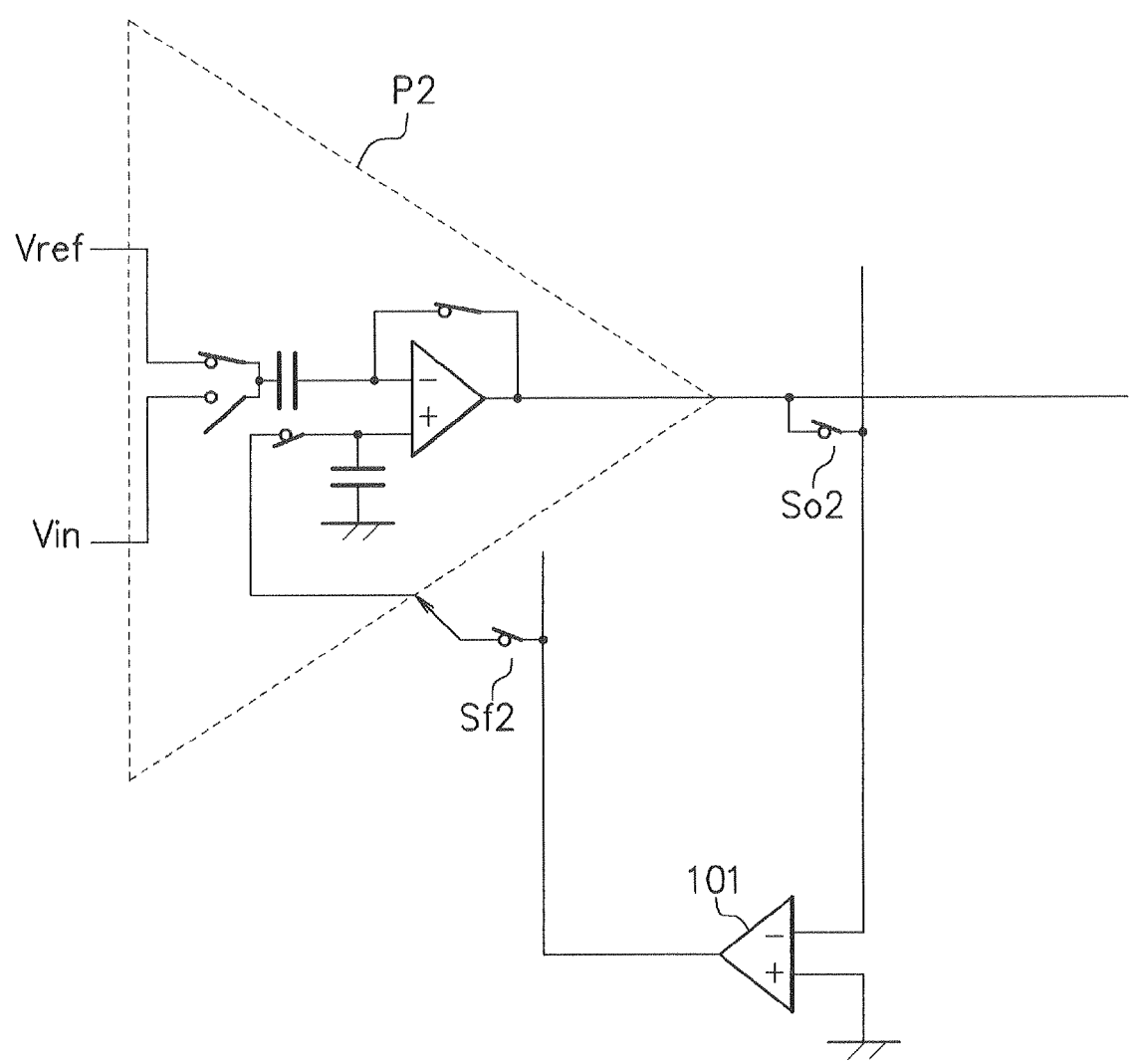
FIG. 11 is a diagram depicting a structural example of the preamplifier and the gain control unit in the case where the gain control unit is provided in the parallel-type ADC depicted in the first embodiment.

The preamplifier P2 and the gain control unit in the case where the gain control unit 91 is provided in the parallel-type ADC depicted in the first embodiment are depicted in FIG. 10 and FIG. 11. FIG. 10 depicts the case where the preamplifier P2 is structured as depicted in FIG. 2. FIG. 11 depicts the case where the preamplifier P2 is structured as depicted in FIG. 3. In either case, it is possible to control the preamplifier outputs to have the similar potential through the interposition of an amplifier 101 in the gain control unit.

FIG. 12 is a diagram for explaining a structure and correction of the interpolation latch in the above-described embodiment.

When reference voltages Vref0, Vref2 are inputted to amplifiers AMP0, AMP2 respectively, inputs and outputs of amplifiers CMP0, CMP1, CMP2 are short-circuited via switches SW1. Thus, nodes between the capacitors and the amplifiers CMP0, CMP1, CMP2 are virtually grounded to the ground, and also their offsets are canceled.

Simultaneously, to nodes between the amplifiers AMP0, AMP2 and the capacitors, outputs when the reference voltages Vref are inputted are applied. By turning off the switches SW1, the amplifiers CMP0, CMP1, CMP2 store in the capacitors outputs of the AMP0, AMP2 when the reference voltages Vref0, Vref2 are inputted.

Next, when an analog input signal Vin is applied to the amplifiers AMP0, AMP2 by switching the switches SW1, SWr, the amplifiers AMP0, AMP2 amplify this signal. The nodes between the capacitors and the amplifiers CMP0, CMP1, CMP2 turn to floating states since the switches are off, and according to the law of conservation of charge, potential variation amounts between the amplifiers AMP0, AMP2 and the capacitors appear in the capacitors and the amplifiers CMP0, CMP1, CMP2 on the basis of the ground.

Specifically, when the gain of an amplifier is G, G(Vin−Vref0), G(Vin−Vref2) are applied to the amplifiers CMP0, CMP2 respectively (where ground=0 V). Further, G{Vin−(Vref0+Vref2)/2} is applied to the amplifier CMP1. This equals to an intermediate voltage between the voltage Vref0 and the voltage Vref2, and comparison with the voltage corresponding to a voltage Vref1 is virtually possible by interpolation. However, the gains G of the amplifiers are actually not the similar, and thus even when an offset is corrected, it becomes an error when performing interpolation.

According to the embodiment, an analog signal processing device used in an ADC becomes high speed and high accuracy.

According to the embodiment, the number of elements is suppressed by using interpolation, and errors caused by the interpolation can be corrected in the background. Moreover, the influence of element dispersion can be eliminated by correction.

As above, according to the embodiment, a highly accurate device is realized by correcting errors caused by interpolation in the background while suppressing the number of elements by the interpolation. By further eliminating the influence of element dispersion by correction, it is made possible to use small size elements by which scaling effects can be obtained, and a high speed device is realized.

It should be noted that the above embodiments merely illustrate concrete examples of implementing the present invention, and the technical scope is not to be construed in a restrictive manner by these embodiments. That is, the present invention can be implemented in various forms without departing from the technical idea or main features thereof.

What is claimed is:

1. An analog signal processing device comprising:
   a voltage selector selecting a given comparison reference voltage from plural comparison reference voltages;
   an arithmetic unit arithmetically processing the given comparison reference voltage and an analog input signal;
   a comparator which has at least one or more judgment points for the plural comparison reference voltages and to which an output of the arithmetic unit is inputted; and
   a coupling controller controlling connections between the arithmetic unit and the comparator, wherein:
   the arithmetic unit comprises correctable first signal processors, and the number of the first signal processors is more than is necessary for the plural comparison reference voltages by M or larger (where M is a natural number); and
   when a set of N (where N is a natural number and N≦M) of first signal processors are in a correction operation, the coupling controller connects first signal processors which are not in the correction operation in the arithmetic unit to the comparator.

2. The analog signal processing device according to claim 1, wherein
   the correctable first signal processors each comprise a storage unit in which the given comparison reference voltage is stored.

3. The analog signal processing device according to claim 1, comprising
   a common correction controller performing correction of the first signal processors.

4. The analog signal processing device according to claim 1, wherein:
   the comparator comprises plural correctable second signal processors, and the number of the second signal processors is more than is necessary for the plural comparison reference voltages by X or larger (where X is a natural number); and
   when a set of Y (where Y is a natural number and Y≦X) of second signal processors are in a correction operation, the first signal processors which are not in the correction operation are connected to second signal processors which are not in the correction operation in the comparator.

5. The analog signal processing device according to claim 4, wherein
   the first signal processors and the second signal processors each comprise a storage unit in which the given comparison reference voltage is stored.

6. The analog signal processing device according to claim 4, comprising
   at least one of a common first correction controller performing correction of the first signal processors and a common second correction controller performing correction of the second signal processors.

7. An analog signal processing device comprising:
   an arithmetic unit arithmetically processing a given comparison reference voltage and an analog input signal;
   a comparator which has at least one or more judgment points for plural comparison reference voltages and to which an output of the arithmetic unit is inputted; and
   a coupling controller controlling connections between the arithmetic unit and the comparator, wherein:
   the comparator comprises first signal processors having a correction function, and the number of the first signal processors is more than is necessary for the plural comparison reference voltages by X or larger (where X is a natural number); and
   when a set of Y (where Y is a natural number and Y≦X) of first signal processors are in a correction operation, the coupling controller connects the arithmetic unit to first signal processors which are not in the correction operation in the comparator.

8. The analog signal processing device according to claim 7, wherein
   the first signal processors each comprise a storage unit in which the given comparison reference voltage is stored.

9. The analog signal processing device according to claim 7, comprising
   a common first correction controller performing correction of the first signal processors.

10. An AD converter comprising:
    an analog signal processing device according to claim 1; and
    a signal converter encoding and converting an output of the analog signal processing device into a digital signal.

11. The AD converter according to claim 10, wherein
    the AD converter is a parallel-type AD converter in which the analog input signal is processed in parallel in the analog signal processing device.

* * * * *